United States Patent
Sayada et al.

(10) Patent No.: US 12,186,988 B2
(45) Date of Patent: Jan. 7, 2025

(54) DISPOSAL OF WATER SOLUBLE WASTE IN ADDITIVE MANUFACTURING

(71) Applicant: Stratasys Ltd., Rehovot (IL)

(72) Inventors: Murielle Sayada, Modiln (IL); Jankiel Kimelblat, RaAnana (IL)

(73) Assignee: Stratasys Ltd., Rehovot (IL)

( * ) Notice: Subject to any disclaimer, the term of this patent is extended or adjusted under 35 U.S.C. 154(b) by 0 days.

(21) Appl. No.: 18/574,861

(22) PCT Filed: Jun. 30, 2022

(86) PCT No.: PCT/IL2022/050706
§ 371 (c)(1),
(2) Date: Dec. 28, 2023

(87) PCT Pub. No.: WO2023/275878
PCT Pub. Date: Jan. 5, 2023

(65) Prior Publication Data
US 2024/0262038 A1    Aug. 8, 2024

Related U.S. Application Data

(60) Provisional application No. 63/216,702, filed on Jun. 30, 2021.

(51) Int. Cl.
*B29C 64/35* (2017.01)
*B29C 64/357* (2017.01)
(Continued)

(52) U.S. Cl.
CPC ............ *B29C 64/357* (2017.08); *B29C 64/40* (2017.08); *B33Y 10/00* (2014.12); *B33Y 40/20* (2020.01); *B29C 64/112* (2017.08)

(58) Field of Classification Search
CPC ..... B29C 64/357; B29C 64/40; B29C 64/112; B33Y 10/00; B33Y 40/20; B33Y 99/00; G03F 7/3092
See application file for complete search history.

(56) References Cited

U.S. PATENT DOCUMENTS 5,734,944 A  *  3/1998  Seeley .................... C02F 1/444
                                                       396/626
6,569,373 B2    5/2003  Napadensky
(Continued)

FOREIGN PATENT DOCUMENTS

EP          2678147        1/2014
WO    WO 2016/142947       9/2016
(Continued)

OTHER PUBLICATIONS

International Preliminary Report on Patentability Dated Jan. 11, 2024 From the International Bureau of WIPO Re. Application No. PCT/IL2022/050706 (12 Pages).
(Continued)

*Primary Examiner* — Waqaas Ali

(57) ABSTRACT

Method and kits for handling an aqueous waste solution or dispersion obtained upon removing a water-miscible support material from a three-dimensional object during additive manufacturing of the object, and additive manufacturing processes utilizing same are provided. The methods and kits utilize a super absorbent polymeric material to convert the liquid waste solution to a solid or semi-solid composition.

14 Claims, 11 Drawing Sheets

(51) Int. Cl.
  *B29C 64/40* (2017.01)
  *B33Y 10/00* (2015.01)
  *B33Y 40/20* (2020.01)
  *B29C 64/112* (2017.01)

(56) References Cited

U.S. PATENT DOCUMENTS

| | | | |
|---|---|---|---|
| 7,183,335 | B2 | 2/2007 | Napadensky |
| 7,479,510 | B2 | 1/2009 | Napadensky et al. |
| 8,598,405 | B2 * | 12/2013 | Masuda ................. B01J 20/103 |
| | | | 524/300 |
| 2012/0213976 | A1 * | 8/2012 | Xu .......................... B29C 64/40 |
| | | | 264/129 |

FOREIGN PATENT DOCUMENTS

| | | |
|---|---|---|
| WO | WO 2017/029657 | 2/2017 |
| WO | WO 2017/122211 | 7/2017 |
| WO | WO 2019/021291 | 1/2019 |
| WO | WO 2019/130321 | 7/2019 |
| WO | WO 2020/141521 | 7/2020 |
| WO | WO 2023/275878 | 1/2023 |

OTHER PUBLICATIONS

International Search Report and the Written Opinion Dated Nov. 17, 2022 From the International Searching Authority Re. Application No. PCT/IL2022/050706. (16 Pages).

Invitation to Pay Additional Fees, Communication Relating to the Results of the Partial International Search and the Provisional Opinion Dated Sep. 27, 2022 From the International Searching Authority Re. Application No. PCT/IL2022/050706. (10 Pages).

\* cited by examiner

DISPOSAL OF WATER SOLUBLE WASTE IN ADDITIVE MANUFACTURING

RELATED APPLICATIONS

This application is a National Phase of PCT Patent Application No. PCT/IL2022/050706 having International filing date of Jun. 30, 2022, which claims the benefit of priority under 35 USC § 119 (e) of U.S. Provisional Patent Application No. 63/216,702 filed on Jun. 30, 2021.

PCT Patent Application No. PCT/IL2022/050706 is also related to U.S. Provisional Patent Application No. 63/216,684, filed on Jun. 30, 2021.

PCT Patent Application No. PCT/IL2022/050706 is also related to PCT Patent Application No. PCT/IL2022/050705, filed on Jun. 30, 2022 entitled "WATER-SOLUBLE SUPPORT MATERIAL FORMULATION USABLE IN ADDITIVE MANUFACTURING", which claims the benefit of priority under 35 USC § 119 (e) of U.S. Provisional Patent Application No. 63/216,684, filed on Jun. 30, 2021.

The contents of the above applications are all incorporated by reference as if fully set forth herein in their entirety.

FIELD AND BACKGROUND OF THE INVENTION

The present invention, in some embodiments thereof, relates to waste management and, more particularly, but not exclusively, to a method of handling water soluble waste resulting from additive manufacturing of three-dimensional objects.

Additive manufacturing is generally a process in which a three-dimensional (3D) object is manufactured utilizing a computer model of the objects. Such a process is used in various fields, such as design related fields for purposes of visualization, demonstration and mechanical prototyping, as well as for rapid manufacturing (RM).

The basic operation of any AM system consists of slicing a three-dimensional computer model into thin cross sections, translating the result into two-dimensional position data and feeding the data to control equipment which manufacture a three-dimensional structure in a layer-wise manner.

Various AM technologies exist, amongst which are stereolithography, digital light processing (DLP), and three-dimensional (3D) printing, 3D inkjet printing in particular. Such techniques are generally performed by layer by layer deposition and solidification of one or more building materials, typically photopolymerizable (photocurable) materials.

In three-dimensional printing processes, for example, a building material is dispensed from a print head having a set of nozzle arrays to deposit layers on a supporting structure. Depending on the building material, the layers may then solidify, harden or cured, optionally using a suitable device.

Various three-dimensional printing techniques exist and are disclosed in, e.g., U.S. Pat. Nos. 6,259,962, 6,569,373, 6,658,314, 6,850,334, 7,183,335, 7,209,797, 7,225,045, 7,300,619, 7,479,510, 7,500,846, 7,962,237 and 9,031,680, all of the same Assignee, the contents of which are hereby incorporated by reference.

A printing system utilized in additive manufacturing may include a receiving medium and one or more print heads. The receiving medium can be, for example, a fabrication tray that may include a horizontal surface to carry the material dispensed from the print head. The print head may be, for example, an ink jet head having a plurality of dispensing nozzles arranged in an array of one or more rows along the longitudinal axis of the print head. The print head may be located such that its longitudinal axis is substantially parallel to the indexing direction. The printing system may further include a controller, such as a microprocessor to control the printing process, including the movement of the print head according to a pre-defined scanning plan (e.g., a CAD configuration converted to a Stereo Lithography (STL) format and programmed into the controller). The print head may include a plurality of jetting nozzles. The jetting nozzles dispense material onto the receiving medium to create the layers representing cross sections of a 3D object.

In addition to the print head, there may be a source of curing energy, for curing the dispensed building material. The curing energy is typically radiation, for example, UV radiation.

Additionally, the printing system may include a leveling device for leveling and/or establishing the height of each layer after deposition and at least partial solidification, prior to the deposition of a subsequent layer.

The building materials may include modeling materials and support materials, which form the object and the temporary support constructions supporting the object as it is being built, respectively.

The modeling material (which may include one or more material(s)) is deposited to produce the desired object/s, and the support material (which may include one or more material(s)) is used, with or without modeling material elements, to provide support structures for specific areas of the object during building and assure adequate vertical placement of subsequent object layers, e.g., in cases where objects include overhanging features or shapes such as curved geometries, negative angles, voids, and so on. Both the modeling and support materials are preferably liquid at the working temperature at which they are dispensed, and subsequently harden or solidify, typically upon exposure to curing energy (e.g., UV curing), to form the required layer shape. After printing completion, support structures are removed to reveal the final shape of the fabricated 3D object.

Known methods for removal of support materials include mechanical impact, which is typically applied by a tool or water-jet, as well as chemical methods, such as dissolution in a solvent, with or without heating. The mechanical methods are labor intensive and are often unsuited for small intricate parts. Mechanical and chemical methods are often also unsuited for office environments.

For dissolving the support materials, the fabricated object is often immersed in water or in a solvent that is capable of dissolving the support materials. The solutions utilized for dissolving the support material are also referred to herein and in the art as "cleaning solutions". In many cases, however, the support removal process may involve hazardous materials, manual labor and/or special equipment requiring trained personnel, protective clothing and expensive waste disposal. In addition, the dissolution process is usually limited by diffusion kinetics and may require very long periods of time, especially when the support constructions are large and bulky. Furthermore, post-processing may be necessary to remove traces of a 'mix layer' on object surfaces. The term "mix layer" refers to a residual layer of mixed hardened model and support materials formed at the interface between the two materials on the surfaces of the object being fabricated, i.e., by model and support materials mixing into each other at the interface between them.

Water-soluble materials for 3D building have been described, for example, in U.S. Pat. No. 6,228,923.

A water-containing support material comprising a fusible crystal hydrate is described in U.S. Pat. No. 7,255,825.

Compositions suitable for support in building a 3D object are described, for example, in U.S. Pat. Nos. 7,479,510, 7,183,335 and 6,569,373, and in WO 2016/142947, WO 2017/029657, WO 2017/122211, WO 2019/130321, WO 2019/021291, and WO 2020/141521, all to the present Assignee. Generally, the compositions disclosed in these patents comprise at least one UV curable (reactive) component, e.g., an acrylic component, at least one non-UV curable component, e.g. a polyol or glycol component, and a photoinitiator. After irradiation, these compositions provide a semi-solid or gel-like material capable of dissolving upon exposure to water, to an alkaline or acidic solution or to a water detergent solution. 3D printing methodologies using such a soluble support material are also known as "Soluble Support Technology" or SST, and the support material formulation is often referred to a "soluble support material" or "soluble support material formulation". Soluble support materials should beneficially feature sufficient water solubility, so as to be removed during a relatively short time period, or sufficient solubility in a non-hazardous cleaning solution, yet, at the same, to exhibit mechanical properties sufficient to support the printed object during the additive manufacturing process.

The use of soluble support technology is limited by the need to manage the aqueous solution obtained upon dissolving a water-soluble support material. Such a solution comprises organic materials (curable and hardened organic materials used to make up the support material) and is considered as hazardous according to regulatory protocols at least in some jurisdictions. This waste therefore cannot be disposed regularly (e.g., by sink or office refuse) and should be managed using dedicated waste disposal services and in accordance with waste regulation, which involve complex, costly and environmentally-unfriendly procedures that reduce the efficiency of the entire AM process.

SUMMARY OF THE INVENTION

According to an aspect of some embodiments of the present invention there is provided a method of handling an aqueous waste solution or dispersion obtained upon removing a water-miscible support material from a three-dimensional object during additive manufacturing of the object, the method comprising contacting the solution with a super absorbent polymeric material to thereby convert the solution to a solid or semi-solid composition.

According to some of any of the embodiments described herein, the method further comprises determining a concentration of the support material in the solution.

According to some of any of the embodiments described herein, the method comprises measuring a refractive index of the solution, wherein the determining the concentration is based on the refractive index.

According to some of any of the embodiments described herein, the method further comprises determining an amount of the supper absorbent polymeric material sufficient for converting the solution into the solid to semi-solid composition.

According to an aspect of some embodiments of the present invention there is provided a method of handling an aqueous waste solution containing a water-miscible support material removed from a three-dimensional object obtained by additive manufacturing, the method comprising contacting the solution with a super absorbent polymeric material, wherein the contacting is with an amount of the super absorbent polymeric material sufficient to convert the solution to the solid or semi-solid composition.

According to some of any of the embodiments described herein, the method further comprises determining a concentration of the soluble support material in the solution, wherein the amount of the super absorbent polymeric material is determined according to the concentration of the support material in the solution.

According to some of any of the embodiments described herein, the determining is by measuring a refractive index of the solution.

According to some of any of the embodiments described herein, determining the amount of the super absorbent polymeric material is in accordance with a calibration curve or a lookup table having a plurality of entries, each including a value of the concentration or the refractive index and a corresponding value of an amount of the super absorbent polymeric material sufficient to convert the solution to the solid or semi-solid composition.

According to some of any of the embodiments described herein, the corresponding value of the amount of the super absorbent polymeric material is in accordance with a volume of the solution.

According to some of any of the embodiments described herein, the contacting is with an amount of the super absorbent polyacrylate in a range of from 1 to 10 folds the amount determined in accordance with the calibration curve or the lookup table and in accordance with the volume of the solution.

According to some of any of the embodiments described herein, a 2-liter solution that comprises about 10% by weight of the soluble support material is contacted with at least 50 grams of the super absorbent polymeric material; a 10-liter solution that comprises about 10% by weight of the soluble support material is contacted with at least 250 grams of the super absorbent polymeric material; a 20-liter solution that comprises about 10% by weight of the soluble support material is contacted with at least 500 grams of the super absorbent polymeric material; a 2-liter solution that comprises about 15% by weight of the soluble support material is contacted with at least 300 grams of the super absorbent polymeric material; a 10-liter solution that comprises about 15% by weight of the soluble support material is contacted with at least 1500 grams of the super absorbent polymeric material; a 20-liter solution that comprises about 15% by weight of the soluble support material is contacted with at least 3500 grams of the super absorbent polymeric material; a 2-liter solution that comprises about 20% by weight of the soluble support material is contacted with at least 400 grams of the super absorbent polymeric material; a 10-liter solution that comprises about 20% by weight of the soluble support material is contacted with at least 2000 grams of the super absorbent polymeric material; and a 20-liter solution that comprises about 20% by weight of the soluble support material is contacted with at least 4500 grams of the super absorbent polymeric material.

According to some of any of the embodiments described herein, a 2-liter solution that comprises from about 10% to about 20% by weight of the soluble support material is contacted with at least 500 grams of the super absorbent polymeric material; a 2-liter to 10-liter solution that comprises about 10% by weight of the soluble support material is contacted with at least 500 grams of the super absorbent polymeric material; a 10-liter solution that comprises about 15% by weight of the soluble support material is contacted with at least 1500 grams of the super absorbent polymeric material; a 20-liter solution that comprises about 15% by weight of the soluble support material is contacted with at least 3500 grams of the super absorbent polymeric material;

a 10-liter solution that comprises about 20% by weight of the soluble support material is contacted with at least 2000 grams of the super absorbent polymeric material; and a 20-liter solution that comprises about 20% by weight of the soluble support material is contacted with at least 4500 grams of the super absorbent polymeric material.

According to some of any of the embodiments described herein, the contacting is performed in a leak-proof container.

According to some of any of the embodiments described herein, the method further comprises disposing the solid or semi-solid composition.

According to some of any of the embodiments described herein, the disposing is effected from 10 minutes to 6 months following the contacting.

According to some of any of the embodiments described herein, the super absorbent polymeric material is a super absorbent polyacrylate.

According to some of any of the embodiments described herein, the waste solution is such that features a chemical oxygen demand higher than 1000 mg/liter at a 1% by weight concentration of the soluble support material.

According to some of any of the embodiments described herein, the method further comprises, prior to the contacting, determining a pH of the waste solution.

According to some of any of the embodiments described herein, when the pH is outside a range of from 3 to 12, or from 3 to 10, or from 4 to 8, or from 6 to 8, or is other than about 7, the method further comprises adding a pH adjusting agent to the waste solution prior to the contacting.

According to an aspect of some embodiments of the present invention there is provided a kit comprising an individually packaged super absorbent polymeric material, and a leak-proof container, the kit being identified for use in handling an aqueous waste solution or dispersion obtained upon removing a water-miscible support material from a three-dimensional object during additive manufacturing of the object.

According to some of any of the embodiments described herein, the kit comprises at least one package comprising the super absorbent polymeric material, wherein an amount of the super absorbent polymeric material in each package ranges from 500 to 1000 grams.

According to some of any of the embodiments described herein, the kit further comprises a lookup table having a plurality of entries, each including a value of a concentration of the support material or a refractive index of the solution and a corresponding value of an amount of the super absorbent polymeric material sufficient to convert the solution to the solid or semi-solid composition.

According to some of any of the embodiments described herein, the corresponding value of the amount of the super absorbent polymeric material is in accordance with a volume of the solution.

According to some of any of the embodiments described herein, the kit further comprises a portable refractometer for measuring a refractive index of the solution.

According to some of any of the embodiments described herein, the kit further comprises a support material formulation that provides, when hardened, the water-miscible support material, the support material formulation being individually packaged with the kit.

According to an aspect of some embodiments of the present invention there is provided a method of additive manufacturing a three-dimensional object, the method comprising: receiving three-dimensional printing data corresponding to the shape of the object; dispensing droplets of an uncured building material in layers, on a receiving medium, using at least one inkjet printing head, according to the printing data, the uncured building material comprising at least one modeling material formulation and at least one support material formulation that provides, when hardened, a water-miscible support material; subsequent to the dispensing, exposing the layers to a curing condition, to thereby provide a hardened modeling material and a hardened, water-miscible support material; repeating the dispensing and the exposing to thereby provide a printed object comprising the hardened modeling material and the hardened, water-miscible support material; removing the hardened support material from the printed object by contacting the printed object with an aqueous solution, preferably a detergent-free aqueous solution, to thereby obtain to provide the three-dimensional object and an aqueous waste solution containing the water-miscible support material; and handling the aqueous waste solution in accordance with the method as described herein in any of the respective embodiments and any combination thereof.

According to an aspect of some embodiments of the present invention there is provided a system for determining an amount of a substance sufficient to convert a liquid solution into a solid or semi-solid composition, the system comprising: a digital refractometer configured for measuring a refractive index of the solution; a dedicated electronic circuit configured for determining the amount of the substance, based on at least the measured refractive index; and a display configured for displaying the determined amount.

According to some of any of the embodiments described herein, the system comprises an encapsulation, wherein the digital refractometer, the circuit, and the display are all encapsulated in, or mounted on, the encapsulation.

According to some of any of the embodiments described herein, the system is configured to be submerged in the solution.

According to some of any of the embodiments described herein, the system comprises a container configured to receive the solution.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

Implementation of the method and/or system of embodiments of the invention can involve performing or completing selected tasks manually, automatically, or a combination thereof. Moreover, according to actual instrumentation and equipment of embodiments of the method and/or system of the invention, several selected tasks could be implemented by hardware, by software or by firmware or by a combination thereof using an operating system.

For example, hardware for performing selected tasks according to embodiments of the invention could be implemented as a chip or a circuit. As software, selected tasks according to embodiments of the invention could be implemented as a plurality of software instructions being executed by a computer using any suitable operating system. In an exemplary embodiment of the invention, one or more tasks according to exemplary embodiments of method and/or system as described herein are performed by a data processor, such as a computing platform for executing a plurality of instructions. Optionally, the data processor includes a volatile memory for storing instructions and/or data and/or a non-volatile storage, for example, a magnetic hard-disk and/or removable media, for storing instructions and/or data. Optionally, a network connection is provided as well. A display and/or a user input device such as a keyboard or mouse are optionally provided as well.

BRIEF DESCRIPTION OF THE SEVERAL VIEWS OF THE DRAWING(S)

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

Figure 5A:
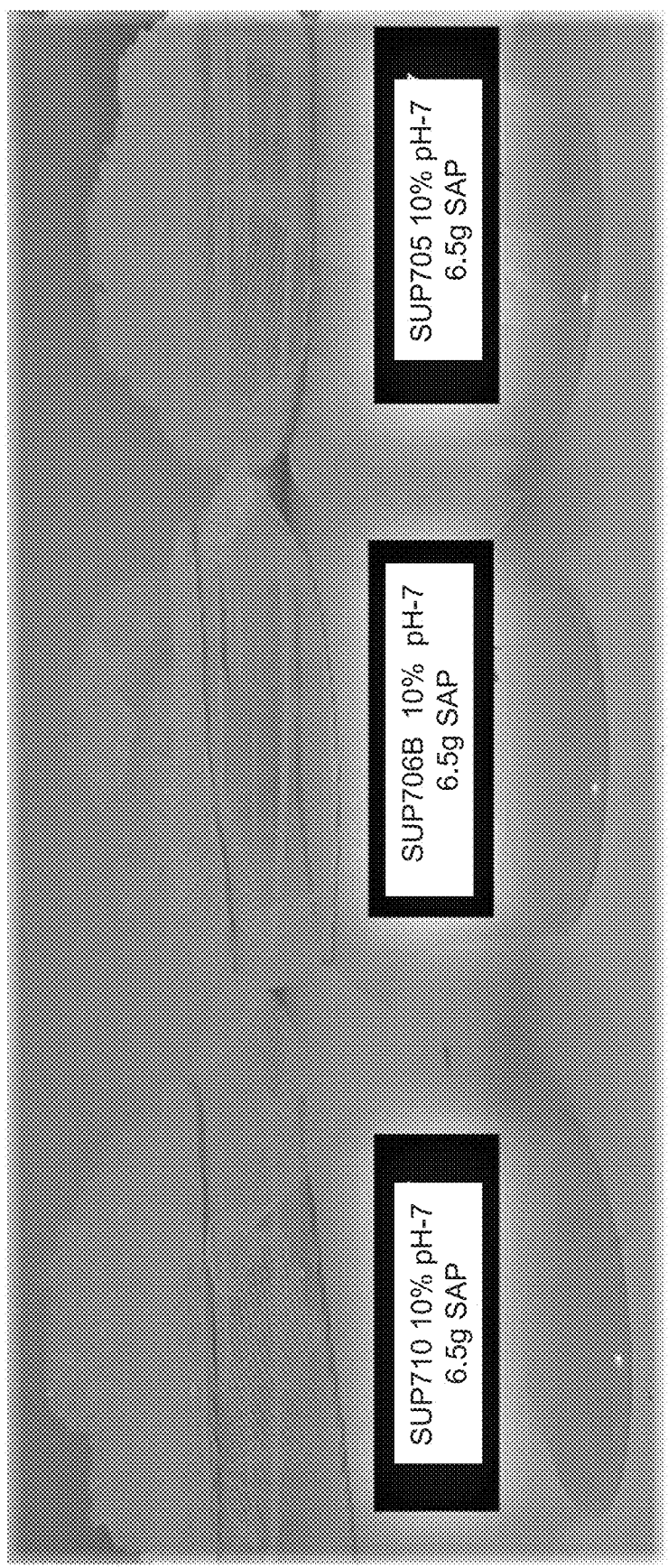
Figure 5B:
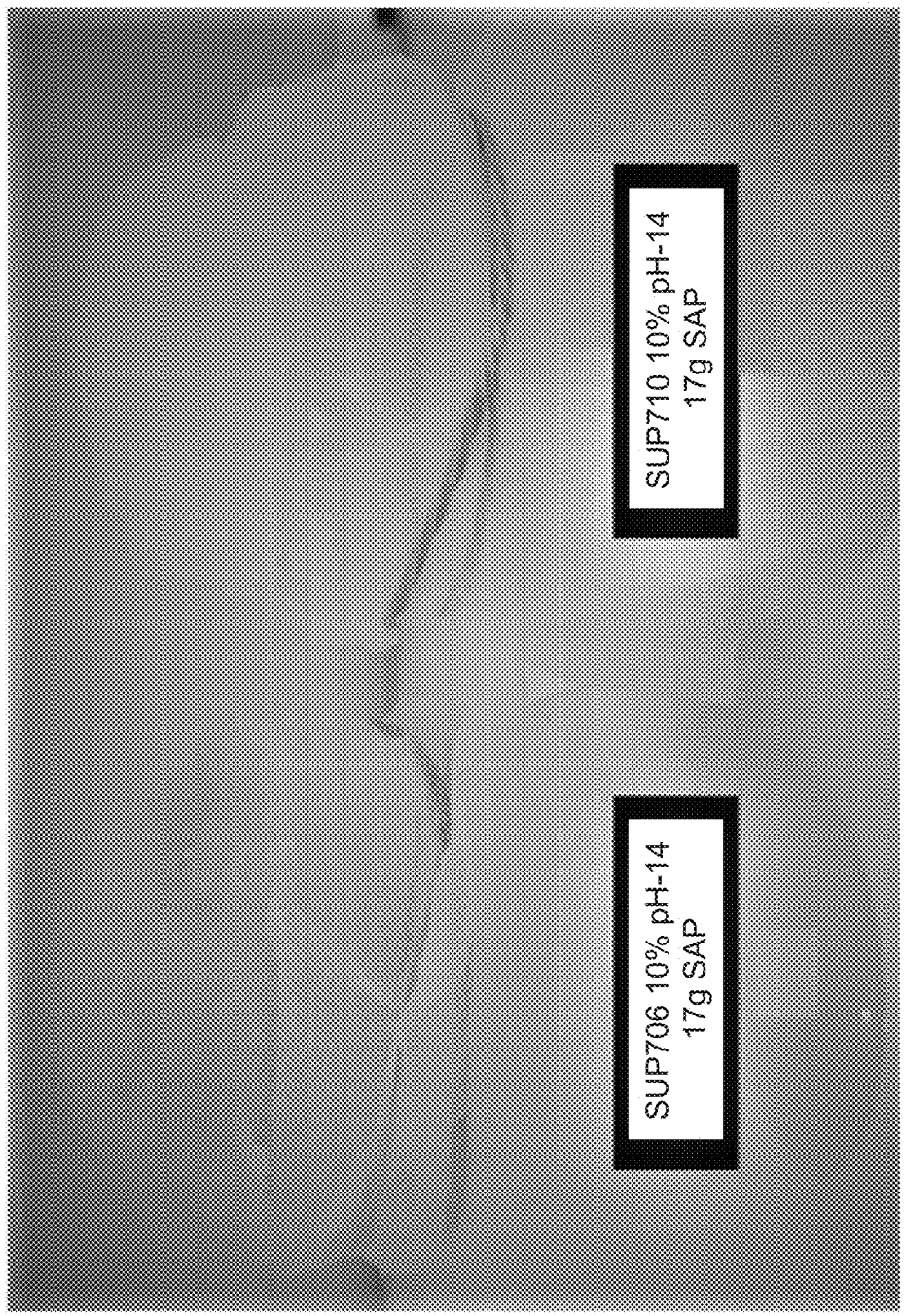

FIGS. 5A and 5B present photographs of waste solutions containing various water-miscible support materials, and featuring various pH values, upon contacting a super absorbent polyacrylate.

Figure 6A:
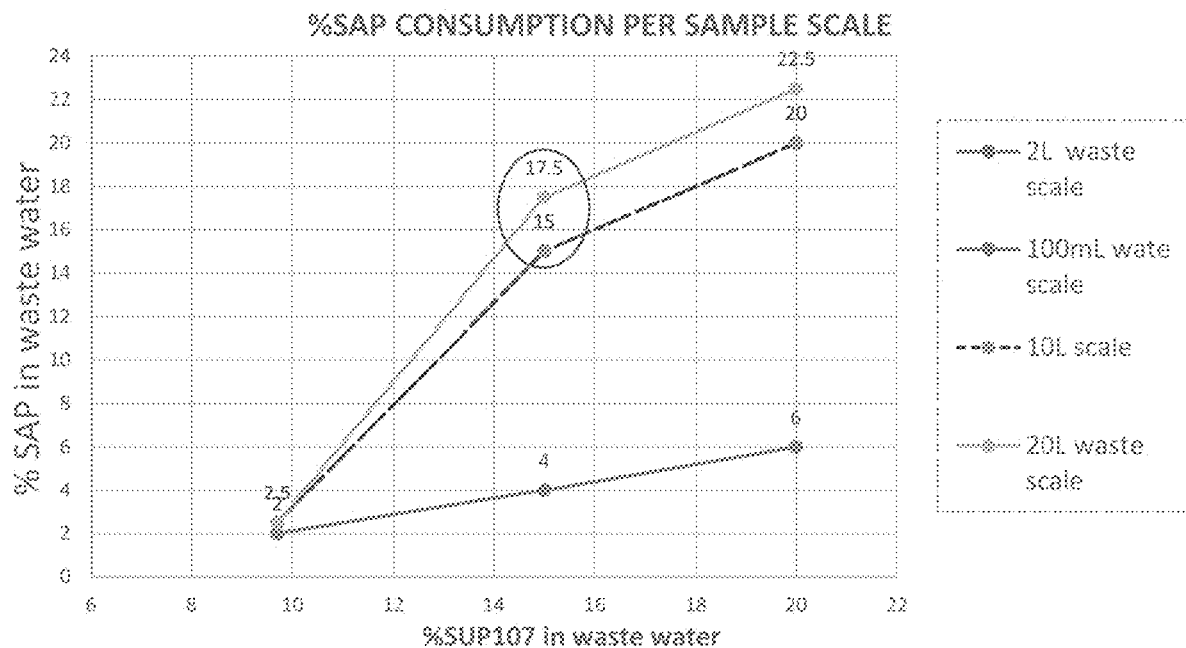
Figure 6B:
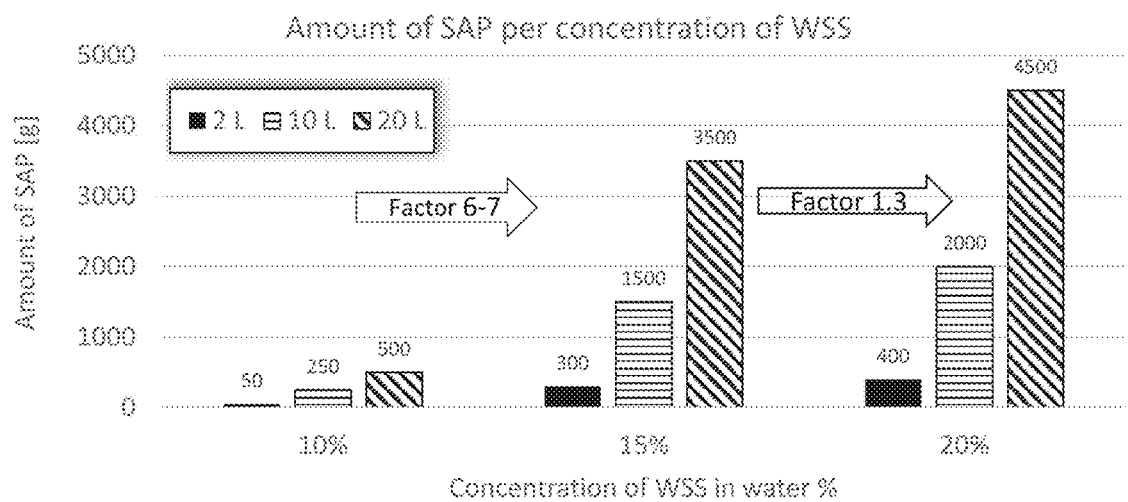

FIGS. 6A and 6B present plots and a bar graph showing the amount of a super absorbent polyacrylate required to covert a solution containing a water soluble support material to a solid or semi-solid composition as a function of the solution's volume and concentration.

Figure 7A:
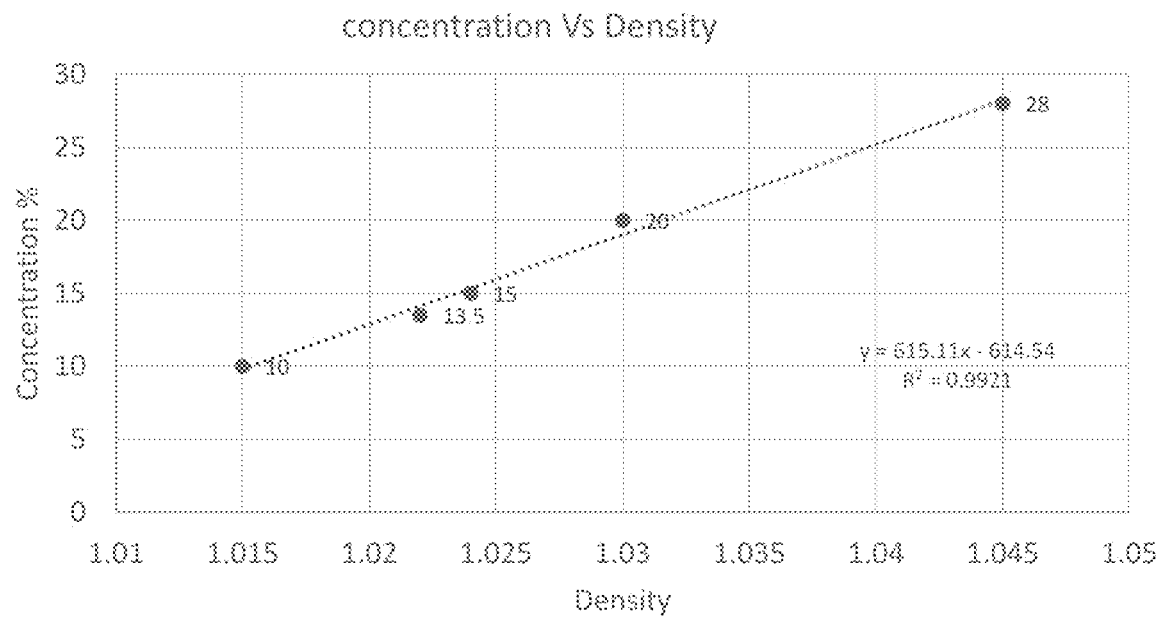
Figure 7B:
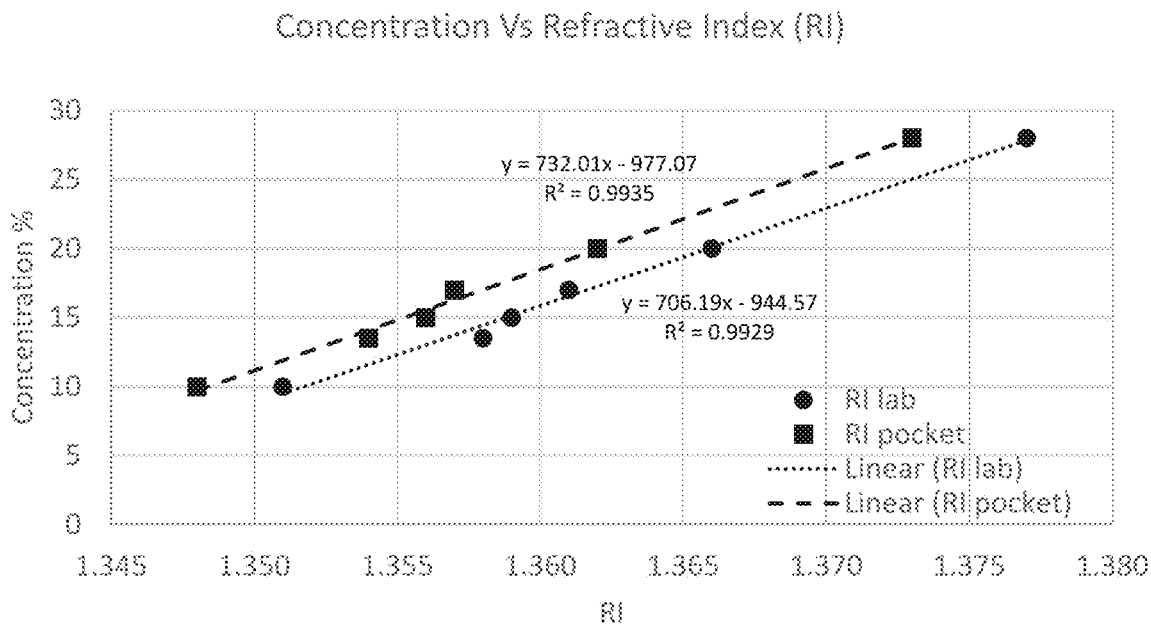

FIGS. 7A and 7B present graphs showing a concentration of an exemplary support material in a waste solution as a function of the solution's density (FIG. 7A) and refractive index (FIG. 7B).

Figure 8A:
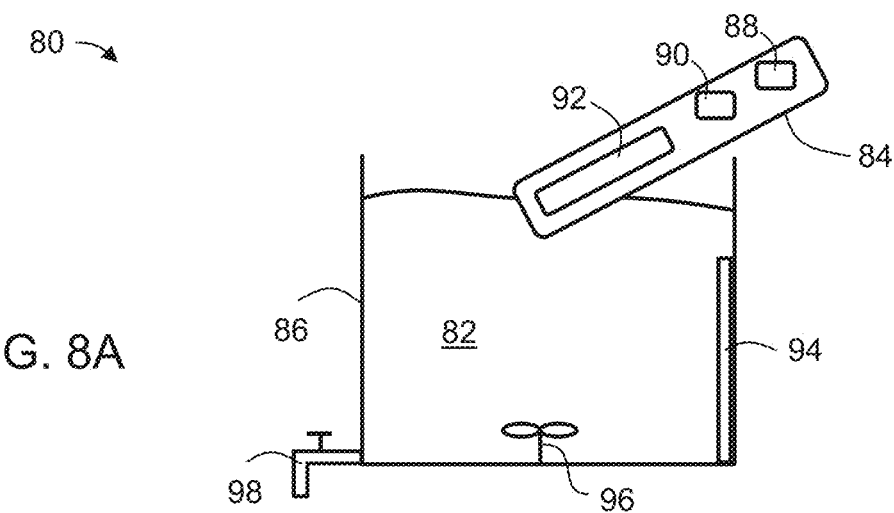
Figure 8B:
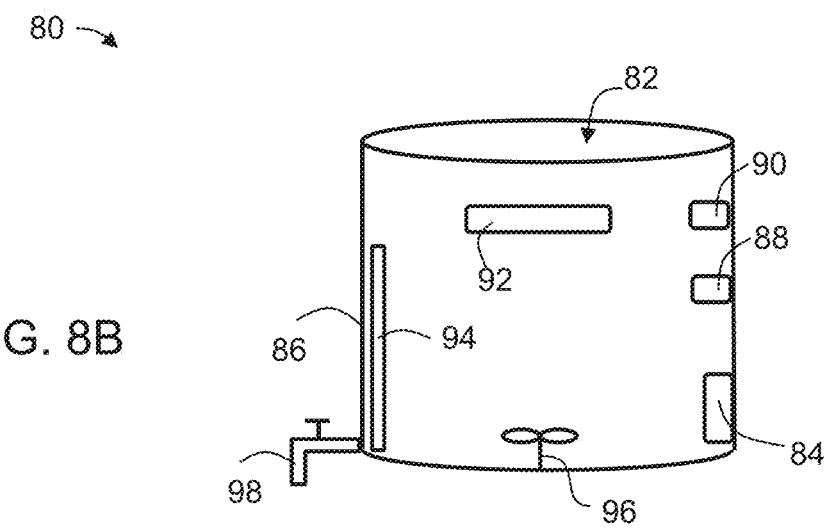

FIGS. 8A and 8B are schematic illustrations of a system for determining an amount of a substance sufficient to convert a liquid solution into a solid or semi-solid composition, according to some embodiments of the present invention.

DESCRIPTION OF SPECIFIC EMBODIMENTS OF THE INVENTION

The present invention, in some embodiments thereof, relates to waste management and, more particularly, but not exclusively, to a method of handling water soluble waste resulting from additive manufacturing of three-dimensional objects.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

As discussed hereinabove, support materials are often used in additive manufacturing such as 3D inkjet printing for ensuring successful manufacturing of objects that feature voids, overhangs, bridges, etc.

Thus a building material (uncured) that comprises the modeling material formulation and the support material formulation is dispensed during the manufacturing process, and then hardened, to provide a hardened support material, where required, and a hardened model material featuring the shape of the desired object.

Preferably, a support material formulation that provides, when hardened, a water-miscible support material is selected, and is removed by contacting the printed object, as defined herein, with water, typically by immersion is static or circulating water, and optionally with the aid of sonication.

The solution obtained upon removal of the hardened support material is considered hazardous in most cases and in accordance with the regulations of most jurisdictions, and hence requires dedicated means for its disposal.

In a search for a solution to the problem of waste management associated with the use of water-miscible or water-soluble support material in additive manufacturing, the present inventors have conceived using a super-absorbent material which would convert the wastewater into solid waste, to thereby facilitate its safe disposal.

The present inventors have studied various super-absorbent materials and have identified those that are most suitable for use in the context of water-soluble or water-miscible support solution. The present inventors have further designed and successfully practiced a methodology for determining the amount of the super-absorbent material required for managing water-soluble/water-miscible support solutions containing varying concentrations of the water-soluble support material.

Embodiments of the present invention therefore relate to a method of waste management that is usable in the context of handling (e.g., disposing) an aqueous waste solution (also referred to herein as waste solution or wastewater) obtained upon removing a water-soluble or water-miscible support material from a three-dimensional printed object obtained in an additive manufacturing process.

Embodiments of the present invention further relate to kits usable for practicing the waste management method.

Embodiments of the present invention further relate to a method of additive manufacturing of a three-dimensional object which utilizes the waste management method as described herein.

Herein throughout, the term "object" or "printed object" or "fabricated object" describes a product of an additive manufacturing process. This term refers to the product obtained by a method as described herein, before removal of the cured support material. A printed object is therefore made of hardened (e.g., cured) modeling material and hardened (e.g., cured) support material, or, collectively, of a hardened building material.

The term "printed object" as used herein throughout refers to a whole printed object or a part thereof.

The term "model", as used herein, describes a final product of the manufacturing process. This term refers to the product obtained by a method as described herein, after removal of the support material. The "object" therefore essentially consists (at least 95 weight percents) of a hardened (e.g., cured) modeling material. This term is also referred to herein as "model object", "final object" or simply as "object".

The terms "model", "model object", "final object" and "object", as used herein throughout, refer to a whole object or a part thereof.

Herein throughout, the phrases "building material formulation", "uncured building material", "uncured building material formulation", "building material" and other variations thereof, collectively describe the materials that are dispensed to sequentially form the layers, as described herein. This phrase encompasses uncured materials dispensed so as to form the object, namely, one or more uncured modeling material formulation(s), and uncured materials dispensed so as to form the support, namely uncured support material formulations.

Herein throughout, the phrase "modeling material formulation", which is also referred to herein interchangeably as "modeling formulation" or simply as "formulation", describes a part of the uncured building material which is dispensed so as to form the model object, as described herein. The modeling formulation is an uncured modeling formulation, which, upon exposure to curing energy, forms the final object or a part thereof.

An uncured building material can comprise one or more modeling formulations, and can be dispensed such that different parts of the model object are made upon curing different modeling formulations, and hence are made of different cured modeling materials or different mixtures of cured modeling materials.

Herein throughout, the phrase "support material formulation", which is also referred to herein interchangeably as "support formulation", describes a part of the uncured building material which is dispensed so as to form the support material, as described herein. The support material formulation is an uncured formulation, which, upon exposure to curing energy, forms the hardened support material.

Herein throughout, the phrases "cured modeling material" and "hardened modeling material", which are used interchangeably, describe the part of the building material that forms a model object, as defined herein, upon exposing the dispensed building material to curing, and following removal of the cured support material, if present. The cured modeling material can be a single cured material or a mixture of two or more cured materials, depending on the modeling material formulations used in the method, as described herein.

Herein throughout, the phrase "hardened support material" is also referred to herein interchangeably as "cured support material" or simply as "support material" and describes the part of the hardened (cured) building material that is intended to support the fabricated final object during the fabrication process, and which is removed once the process is completed and a hardened modeling material is obtained.

In some of any of the embodiments described herein, an uncured formulation (of a building material, a support material and a modeling material) is typically a curable formulation, which forms a hardened material upon curing.

Herein throughout, the term "curable formulation" describes a mixture of materials which, when exposed to curing energy, as described herein, solidifies or hardens to form a cured material as defined herein. Curable formulations comprise one or more curable materials, and may optionally further comprise one or more non-curable materials, initiators, and other additives.

The formulations forming the building material (modeling material formulations and support material formulations) comprise one or more curable materials, which, when exposed to a curing condition, form hardened (cured) material.

Herein throughout, a "curable material" is a compound (typically a monomeric or oligomeric compound, yet optionally a polymeric material) which, when exposed to a curing condition, as described herein, solidifies or hardens to form a cured material. Curable materials are typically polymerizable materials, which undergo polymerization and/or cross-linking when exposed to a suitable curing condition (e.g., a suitable energy source).

Herein, the phrases "exposing to a curing energy", "exposing to curing", "exposing to curing conditions" and "exposing to an energy source that affects curing", and grammatically diversions thereof, are used interchangeably, and mean that dispensed layers of uncured building material are exposed to the curing energy and the exposure is typically performed by applying a curing energy to the dispensed layers.

A "curing energy" typically includes application of radiation or application of heat.

The radiation can be electromagnetic radiation (e.g., ultraviolet or visible light), or electron beam radiation, or ultrasound radiation or microwave radiation, depending on the materials to be cured. The application of radiation (or irradiation) is effected by a suitable radiation source.

A curable material, according to the present embodiments, also encompasses materials which harden or solidify (cure) without being exposed to a curing energy, but rather to a curing condition (for example, upon exposure to a chemical reagent), or simply upon exposure to the environment.

The terms "curable" and "solidifyable" as used herein are interchangeable.

The polymerization can be, for example, free-radical polymerization, cationic polymerization or anionic polymerization, and each can be induced when exposed to curing energy such as, for example, radiation, heat, etc., as described herein.

In some of any of the embodiments described herein, a curable material is a photopolymerizable material, which polymerizes and/or undergoes cross-linking upon exposure to radiation, as described herein, and in some embodiments the curable material is a UV-curable material, which polymerizes and/or undergoes cross-linking upon exposure to UV radiation, as described herein.

In some embodiments, a curable material as described herein is a photopolymerizable material that polymerizes via photo-induced free-radical polymerization. Alternatively, the curable material is a photopolymerizable material that polymerizes via photo-induced cationic polymerization.

In some of any of the embodiments described herein, a curable material can be a monomer, an oligomer or a short-chain polymer, each being polymerizable and/or cross-linkable as described herein.

In some of any of the embodiments described herein, when a curable material is exposed to a curing condition (e.g., radiation), it hardens (undergoes curing) by any one, or combination, of chain elongation and cross-linking.

In some of any of the embodiments described herein, a curable material is a monomer or a mixture of monomers which can form a polymeric material upon a polymerization reaction, when exposed to a curing condition (e.g., curing energy) at which the polymerization reaction occurs. Such curable materials are also referred to herein as monomeric curable materials.

In some of any of the embodiments described herein, a curable material is an oligomer or a mixture of oligomers which can form a polymeric material upon a polymerization reaction, when exposed to a curing condition (e.g., curing energy) at which the polymerization reaction occurs. Such curable materials are also referred to herein as oligomeric curable materials.

In some of any of the embodiments described herein, a curable material, whether monomeric or oligomeric or polymeric, can be a mono-functional curable material or a multi-functional curable material.

Herein, a mono-functional curable material comprises one functional group that can undergo polymerization when exposed to a curing condition (e.g., curing energy such as radiation).

A multi-functional curable material comprises two or more, e.g., 2, 3, 4 or more, functional groups that can undergo polymerization when exposed to a curing condition (e.g., curing energy). Multi-functional curable materials can be, for example, di-functional, tri-functional or tetra-functional curable materials, which comprise 2, 3 or 4 groups that can undergo polymerization, respectively. The two or more functional groups in a multi-functional curable material are typically linked to one another by a linking moiety, as defined herein. When the linking moiety is an oligomeric or polymeric moiety, the multi-functional group is an oligomeric or polymeric multi-functional curable material. Multi-functional curable materials can undergo polymerization when subjected to a curing condition (e.g., curing energy) and/or act as cross-linkers.

Wastewater Handling (Waste Management):

As discussed herein, the present inventors have devised a methodology that facilitates the handling and disposal of wastewater obtained upon removing a water-miscible (e.g., water-soluble) support material from a three-dimensional object obtained in additive manufacturing.

Herein throughout, the term "water-miscible" describes a material which is at least partially dissolvable or dispersible in water, that is, at least 50% of the molecules move into the water upon mixture at room temperature. This term encompasses the terms "water-soluble" and "water dispersible".

Herein throughout, the term "water-soluble" describes a material that when mixed with water in equal volumes or weights at room temperature, a homogeneous solution is formed.

Herein throughout, the term "water-dispersible" describes a material that forms a homogeneous dispersion when mixed with water in equal volumes or weights.

The methodology provided herewith is usable for handling an aqueous solution that comprises a hardened support material formed as a part of a printed object, as defined herein, in additive manufacturing of a three-dimensional object, upon removal of the hardened support material so as to uncover the final object, as defined herein.

By "hardened support material" it is meant herein a material formed once a dispensed support material formulation is exposed to a curing condition. In some embodiments, a "hardened material" is a polymeric material formed when a curable material undergoes polymerization and/or cross-linking, as described herein, upon exposure to a curing condition (e.g., curing energy) as described herein. According to the present embodiments, the hardened support material is water-miscible or water-soluble as defined herein.

An aqueous solution containing the hardened support material is typically obtained upon contacting a printed object with water or an aqueous solution, whereby the printed object is obtained upon dispensing layers of a building material that comprises a modeling material formulation and a support material formulation and exposing the layers to a curing condition, as described herein. The term "aqueous solution" in the context of these embodiments encompasses also aqueous dispersion and aqueous emulsion, in which a portion of the non-aqueous materials is not completely dissolved but rather dispersed.

When the printed object is contacted with an aqueous solution, the hardened support material is removed from the printed object to thereby uncover the final object.

The obtained aqueous solution typically comprises the dissolved or dispersed hardened support material, and optionally decomposition products thereof, for example, products formed upon decomposition of polymerized curable materials that form a part of the support material formulation and/or the modeling material formulation used in the additive manufacturing, and water-miscible non-curable materials included in the support material formulation.

According to an aspect of some embodiments of the present invention there is provided a method of handling an aqueous waste solution (or dispersion or emulsion) obtained upon removing a water-miscible support material from a three-dimensional object during additive manufacturing of the object. The method is effected by converting the aqueous solution (or dispersion or emulsion) to a solid or semi-solid (e.g., hydrogel) by means of contacting the solution with a super absorbent material.

According to some of any of the embodiments described herein, the super absorbent material is an organic material, and in some embodiments it is a polyacrylate.

According to some of any of the embodiments described herein, the super absorbent material is a super absorbent organic polymer, and in some embodiments it is a super absorbent polyacrylate, for example, a sodium polyacrylate.

Herein, the phrases "a polymeric super absorbent material", "a super absorbent polymeric material" and "a super absorbent polymer", and the abbreviation "SAP", are used interchangeably.

Any polymeric super absorbent materials are contemplated.

Exemplary commercially available super absorbent polyacrylates include, without limitation, those marketed under the tradenames SNN580-H and SNN781S, by Socco; KFM9910 and KFM9963, by Kroff; and T5066F, PAC300F, T100F, CREBALOC SIS, T5088 and Z1069, by Evonik.

Any other commercially available super absorbent polymers are also contemplated.

According to some embodiments, the super absorbent polymer (e.g., super absorbent polyacrylate) has an average particles size (e.g., d50) higher than 100 micrometers, or higher than 200 micrometers (e.g., includes particles having a size of from 100 to 800 micrometers).

According to some embodiments, at least 10%, for example, from 10 to 30 5, of the particles has a size lower than 300 micrometers, for example, from 150 to 400 micrometers.

According to some of any of the embodiments described herein, the amount of the super absorbent polymer (super absorbent polyacrylate) that is contacted with the waste solution is determined per the volume of the solution and the concentration of the support material dissolved or dispersed therein.

According to some of any of the embodiments described herein, the method further comprises determining a concentration of the soluble support material in the waste solution.

Determining the concentration can be performed by any method known in the art. In exemplary embodiments, determining the concentration is by means of a densitometer, by determining the density of the waste solution. In exemplary embodiments, determining the concentration is by means of a refractometer, by measuring a refractive index of the waste solution.

As exemplified in FIGS. 7A-B, a linear correlation has been observed between a concentration of an exemplary support material in an aqueous solution and its density or refractive index, such that a calibration curve can be readily generated for determining a concentration of a dissolved support material in a waste solution per its density data or refractive index data.

According to some embodiments, determining the concentration of the dissolved support material in the waste solution is by measuring a refractive index or density of the solution and using a calibration curve or a lookup table having a plurality of entries, each including a value of the refractive index and/or density and a corresponding value of a respective concentration of the support material. In some embodiments, the calibration curve or lookup table is specific to the type of support material that is dissolved in the waste solution. In these embodiments, there is a plurality of calibration curves or lookup tables, each being specific to a different support material, and the method selects the calibration curve or lookup table based on the type of support material that is dissolved in the waste solution. In other embodiments, a single lookup table is used, except that each entry of this single lookup table also includes information pertaining to the type of support material.

Measuring the density can be performed using any available densitometer, which can be stationary (e.g., as in common laboratory equipment) or portable.

Measuring the refractive index can be performed using any available refractometer, which can be stationary (e.g., as in common laboratory equipment) or portable.

Upon determining the concentration of the dissolved support material in the waste solution, and the volume of a waste solution to be treated, an amount of the supper absorbent material which is sufficient for converting the solution into the solid to semi-solid composition can be determined.

Determining the amount of the super absorbent polymeric material can be made in accordance with a calibration curve or a lookup table having a plurality of entries, each including a value of a support material related parameter and a corresponding value of an amount of the super absorbent polymeric material sufficient to convert the solution to a solid or semi-solid composition.

The support material related parameter is a parameter that correlates to the concentration, and optionally and preferably also to the amount, of the support material in the waste solution. In accordance with the aforementioned linear relation between the concentration and the density, as well as between the concentration and refractive index, the support material related parameter includes at least one of the concentration of the support material in the waste solution, the density of the support material in the waste solution, and the refractive index of the waste solution.

Such lookup tables and/or calibration curves can be generated by routine experimentation for example, for, pairs of a selected super absorbent material and a selected soluble support material. An exemplary table is presented in the Examples section that follows.

In some embodiments, the calibration curve or lookup table for determining the sufficient amount of the super absorbent material is specific to the type of support material that is dissolved in the waste solution, and optionally and preferably also to the type of super absorbent material. In these embodiments, there is a plurality of calibration curves or lookup tables, each being specific to a different support material and optionally also a different super absorbent material, and the method selects the calibration curve or lookup table based on the type of support material that is dissolved in the waste solution, and optionally also based on the type of super absorbent material to be used for converting the solution to solid or semi-solid composition. In other embodiments, a single lookup table is used, except that each entry of this single lookup table also includes information pertaining to the type of support material and optionally also the type of super absorbent material.

As exemplified in FIGS. 6A-B, the required amount of the super absorbent material increases nonlinearly with the concentration of the support material in the waste solution, wherein the increase is higher for lower values of the concentration than for higher values of the concentration. Thus, according to some embodiments of the present invention the calibration curve or a lookup table provides the required amount of the super absorbent for a given support material related parameter in a nonlinear way. Specifically, the required amount of the super absorbent material provided by the calibration curve or a lookup table of the present embodiments increases nonlinearly with the support material related parameter, wherein the increase is higher for lower values of the support material related parameter than for higher values of the support material related parameter.

Such a nonlinear dependence on the support material related parameter is characterized mathematically by a negative second derivative. Thus, according to some embodiments of the present invention the calibration curve is characterized mathematically by a negative second derivative with respect to the support material related parameter, and according to some embodiments of the present invention the relations between the values of support material related parameter listed in the lookup table, and the corresponding required amounts of the super absorbent material listed in the lookup table, are fittable to a nonlinear function of the support material related parameter, wherein the nonlinear function has a negative second derivative with respect to the support material related parameter.

As the required amount of the super absorbent material may depend also on the volume of the waste solution to be handled, the calibration curve or lookup table may also include this parameter.

As exemplified in FIGS. 6A-B, for a relatively high (e.g., above 10%) concentration of the support material in the waste solution, the required amount of the super absorbent material increases nonlinearly with the volume of the waste solution, wherein the increase is lower for lower volumes of the waste solution than for higher volumes of the waste solution. Thus, according to some embodiments of the present invention the calibration curve or a lookup table provides the required amount of the super absorbent for a given volume of the waste solution in a nonlinear way. Specifically, for relatively high (e.g., above 10%) concentration of the support material in the waste solution, the required amount of the super absorbent material provided by the calibration curve or a lookup table of the present embodiments increases nonlinearly with the volume of the waste solution, wherein the increase is lower for lower volumes of the waste solution than for higher volumes of the waste solution.

Such a nonlinear dependence on the volume of the waste solution is characterized mathematically by a positive second derivative. Thus, according to some embodiments of the present invention, for a relatively high (e.g., above 10%)

concentration of the support material in the waste solution, the calibration curve is characterized mathematically by a positive second derivative with respect to the volume of the waste solution, and according to some embodiments of the present invention, for relatively high (e.g., above 10%) concentration of the support material in the waste solution, the relations between the volumes of the waste solution listed in the lookup table, and the corresponding required amounts of the super absorbent material listed in the lookup table, are fittable to a nonlinear function of the volume of the waste solution, wherein the nonlinear function has a positive second derivative with respect to the volume of the waste solution.

Also contemplated, are embodiments in which the calibration curve or lookup table exhibits a positive second derivative with respect to the volume of the waste solution for all values of the support material related parameter.

It is to be noted that the amount of the super absorbent material that is used while handling the waste solution can be higher than the amount determined as sufficient to convert the solution to a solid or semi-solid composition, for example, higher by 2-folds, 3-folds, 4-folds, 5-folds, and even higher, for example, 10-folds or more, as demonstrated, for example, in the Examples section that follows.

The actual amount of the super absorbent material can be determined based on the amount sufficient to convert the solution to a solid or semi-solid composition, as described herein, and can be the same or higher than the "sufficient amount". In various exemplary embodiments of the invention the actual amount of the super absorbent material is not less than the sufficient amount as determined based on the aforementioned lookup table or calibration curve. The actual amount can be determined in accordance with the packaging of the super absorbent material, for example, of the super absorbent material is provided in packages of 250 grams each, and the amount determined as sufficient is 350 grams, 2 full packages can be added to the waste solution (a total of 500 grams), while maintaining the desired conversion to a solid or semi-solid material, and without a need to weigh an exact amount of the super absorbent material. Generally, the actual amount of the super absorbent material equals $N_p \cdot m_p$, where $N_p$ is the number of packages of super absorbent material to be used, and $m_p$ is the amount (e.g., mass) of super absorbent material contained in a single package. The value of $N_p$ can be any integer, preferably but not necessarily the smallest integer, that is equal to or larger than the ratio between the sufficient amount (as determined based on the aforementioned lookup table or calibration curve) and $m_p$.

According to some embodiments of the present invention, a method of handling an aqueous waste solution as described herein comprises contacting the solution with a super absorbent material as described herein in any of the respective embodiments, wherein the contacting is with an amount of the super absorbent polymeric material (e.g., a super absorbent polyacrylate) sufficient to convert the solution to the solid or semi-solid composition, and such an amount is determined in accordance with a volume of the solution and upon determining a concentration of the support material in the solution, for example, a measuring its refractive index, as described herein.

In exemplary embodiments, the method is effected in accordance with the following:
- a 2-liter waste solution that comprises about 10% by weight of the soluble support material is contacted with at least 50 grams of the super absorbent polymeric material (e.g., a super absorbent polyacrylate);
- a 10-liter waste solution that comprises about 10% by weight of the soluble support material is contacted with at least 250 grams of the super absorbent polymeric material (e.g., a super absorbent polyacrylate);
- a 20-liter waste solution that comprises about 10% by weight of the soluble support material is contacted with at least 500 grams of the super absorbent polymeric material (e.g., a super absorbent polyacrylate);
- a 2-liter waste solution that comprises about 15% by weight of the soluble support material is contacted with at least 300 grams of the super absorbent polymeric material (e.g., a super absorbent polyacrylate);
- a 10-liter waste solution that comprises about 15% by weight of the soluble support material is contacted with at least 1500 grams of the super absorbent polymeric material (e.g., a super absorbent polyacrylate);
- a 20-liter waste solution that comprises about 15% by weight of the soluble support material is contacted with at least 3500 grams of the super absorbent polymeric material (e.g., a super absorbent polyacrylate);
- a 2-liter waste solution that comprises about 20% by weight of the soluble support material is contacted with at least 400 grams of the super absorbent polymeric material (e.g., a super absorbent polyacrylate);
- a 10-liter waste solution that comprises about 20% by weight of the soluble support material is contacted with at least 2000 grams of the super absorbent polymeric material (e.g., a super absorbent polyacrylate); and
- a 20-liter waste solution that comprises about 20% by weight of the soluble support material is contacted with at least 4500 grams of the super absorbent polymeric material (e.g., a super absorbent polyacrylate);
- a 2-liter waste solution that comprises from about 10% to about 20% by weight of the soluble support material is contacted with at least 500 grams of the super absorbent polymeric material (e.g., a super absorbent polyacrylate);
- a 2-liter to 10-liter waste solution that comprises about 10% by weight of the soluble support material is contacted with at least 500 grams of the super absorbent polymeric material (e.g., a super absorbent polyacrylate);
- a 10-liter waste solution that comprises about 15% by weight of the soluble support material is contacted with at least 1500 grams of the super absorbent polymeric material (e.g., a super absorbent polyacrylate);
- a 20-liter waste solution that comprises about 15% by weight of the soluble support material is contacted with at least 3500 grams of the super absorbent polymeric material (e.g., a super absorbent polyacrylate);
- a 10-liter waste solution that comprises about 20% by weight of the soluble support material is contacted with at least 2000 grams of the super absorbent polymeric material (e.g., a super absorbent polyacrylate); and
- a 20-liter waste solution that comprises about 20% by weight of the soluble support material is contacted with at least 4500 grams of the super absorbent polymeric material (e.g., a super absorbent polyacrylate).

According to some of any of the embodiments described herein, prior to contacting the super absorbent material and the waste solution, the pH of the waste solution is measured, and, if a pH is lower than 3 or higher than 12, or higher than 10, the method can further comprise adjusting the pH of the waste solution, by adding a pH adjusting agent, to obtain a solution having a pH in a range of from 3 to 12, or from 3 to 10, or from 5 to 10, preferably of from 6 to 8, including any intermediate values and subranges therebetween, or of about 7.

The pH adjusting agent is preferably an acid or a base, optionally an aqueous solution of acid or base, added in an amount sufficient to modify the pH of the waste solution to be within a range as indicated hereinabove.

Alternatively, when pH of the waste solution is lower than 3 or higher than 10, upon determining a sufficient amount of the super absorbent material per the volume and concentration of the waste solution, an amount which is at least 1.5-folds, or at least 2-folds, for example, a·5-folds, 2-folds, 2.5 folds, 3-folds, 3.5-folds, 4-folds or 5-folds, of the amount determined as "sufficient" as described, is contacted with the waste solution. Reference is made in this regard to the Examples section that follows, where it is shown that an effective performance of the super absorbent material is observed also for a waste solution with a pH of 14, when a higher amount of the super absorbent material is used.

According to some of any of the embodiments described herein, contacting the super absorbent polymeric material and the waste solution is performed in a container, which can thereafter be sealed and stored, if required, at room temperature. The container can be disposed regularly, as a non-hazardous solid waste.

Preferably, but not obligatory, the container is a leak-proof container.

The container can be disposed once the solution is converted to a solid or semi-solid composition, which can be a few seconds or minutes following the contacting. The container can be disposed also days, weeks and even months following the contacting. As shown in the Examples section that follows, the obtained composition remains stable (namely, no liquid leaches and no phase change observed) when stored at room temperature for a long time.

The Waste Solution:

As described herein, the waste solution comprises a dissolved support material and typically an aqueous solution used to remove the hardened support material from a printed object (a cleaning solution).

Any support material that is miscible, soluble or dispersible in water or an aqueous solution is contemplated.

The support material can be, for example, a hardened material formed upon exposing a support material formulation to a curing condition.

Examples of support material formulations that form a hardened water-soluble or water-miscible support material include, without limitation, those marketed by Stratasys Ltd. As SUP 705, SUP 706, SUP 707, and SUP 710.

Exemplary support material formulations that provide a water-soluble or water-miscible support material that is dissolved in a waste solution as described herein may typically include one or more mono-functional curable materials, typically one or more hydrophilic mono-functional curable material, optionally multi-functional curable materials, and one or more water-soluble or water-miscible polymers, such as polyols. The support material formulation may comprise other curable and non-curable materials that improve the support material performance and/or water solubility. Exemplary support material formulations include (meth)acrylic materials as the curable materials.

Herein throughout, the term "water-miscible" describes a material which is at least partially dissolvable or dispersible in water, that is, at least 50% of the molecules move into the water upon mixture at room temperature. This term encompasses the terms "water-soluble" and "water dispersible".

Herein throughout, the term "water-soluble" describes a material that when mixed with water in equal volumes or weights, at room temperature, a homogeneous solution is formed.

Herein throughout, the term "water-dispersible" describes a material that forms a homogeneous dispersion when mixed with water in equal volumes or weights, at room temperature.

Exemplary support material formulations that are usable and in the context of the present embodiments, and waste solutions containing dissolved hardened support material obtained therefrom are described, for example, in U.S. Pat. Nos. 7,479,510, 7,183,335 and 6,569,373, WO 2016/142947, WO 2017/029657, WO 2017/122211, WO 2019/130321, WO 2019/021291, WO 2020/141521, all to the present assignee.

The aqueous solution can be water or an aqueous solution that is usable as a "cleaning solution" for dissolving a soluble supper material. Any cleaning solution is contemplated. It is to be noted that many types of water-soluble support materials are soluble in alkaline aqueous solutions, for example, aqueous solutions that contain alkali metal hydroxide and/or alkali metal silicate. When such a cleaning solution is used, the waste solution typically features a pH of 14 and is handled as described herein for such waste solutions. An exemplary cleaning solution is described in WO 2017/029658.

According to exemplary embodiments, the support material formulation is as described in U.S. Provisional Patent Application No. 63/216,684, filed Jun. 30, 2021 and in co-filed PCT International Patent Application, entitled "WATER-SOLUBLE SUPPORT MATERIAL FORMULATION USABLE IN ADDITIVE MANUFACTURING", the contents of which are all incorporated by reference as if fully set forth herein in their entirety, and the waste solution comprises a hardened support material formed of such a formulation, dissolved in water or an aqueous solution.

According to exemplary embodiments, the waste solution comprises a dissolved support material that is formed from (e.g., upon hardening of) a support material formulation that comprises a hydrophilic curable mono-functional material; a polyol having a molecular weight lower than 1,000, or lower than 800 grams/mol; and a polyester material having an average molecular weight higher than 400, or higher than 500, grams/mol.

According to some of these embodiments, an amount of the polyester material is no more than 25% by weight of the total weight of the formulation.

According to some of these embodiments, an amount of the polyester material ranges from 10 to 20% by weight of the total weight of the formulation.

According to some of these embodiments, the polyester material is liquid at room temperature or is soluble in the formulation at room temperature.

According to some of these embodiments, the polyester material is or comprises a polycaprolactone.

According to some of these embodiments, the polyol is a branched polyol.

According to some of these embodiments, an average molecular weight of the polyol ranges from 500 to 900, or from 500 to 800, or from 600 to 800, grams/mol.

According to some of these embodiments, an amount of the polyol ranges from 30 to 60, or from 30 to 50, or from 35 to 45, % by weight of the total weight of the formulation.

According to some of these embodiments, the polyol is a branched poly(alkylene glycol), for example, a branched poly(propylene glycol).

According to some of these embodiments, a weight ratio of the polyol to the polyester material is no more than 4:1 or no more than 3:1.

According to some of these embodiments, a weight ratio of the polyol to the polyester material ranges from about 3:1 to about 2:1.

According to some of these embodiments, the hydrophilic curable material is a photocurable material.

According to some of these embodiments, the support material formulation further comprises a photoinitiator.

According to some of these embodiments, an amount of the photoinitiator ranges from 0.5 to 3% by weight of the total weight of the formulation.

According to some of these embodiments, the support material formulation further comprises a surface active agent.

According to some of these embodiments, the support material formulation further comprises a polymerization inhibitor.

Herein throughout, whenever a "soluble support material" is referred to in the context of a waste solution, it is meant a hardened support material obtained in AM process, which has been removed from the printed object upon contacting an aqueous solution (e.g., a cleaning solution as described herein). This phrase therefore encompasses the dissolved or dispersed or suspended hardened support material that is present in the waste solution.

According to some of any of the embodiments described herein, the waste solution comprises from 0.1 to about 30, or from 0.1 to about 20, or from about 1 to about 30, or from about 1 to about 20, % by weight of the support material, including any intermediate values and subranges therebetween.

According to some of any of the embodiments described herein, the waste solution is such that features a chemical oxygen demand higher than 1000 mg/liter at a 1% by weight concentration of said soluble support material.

By "chemical oxygen demand" or COD it is meant an indicative measure of the amount of oxygen that can be consumed by reactions of a solution, commonly used to quantify the amount of organic materials in an aqueous solution. COD is typically determined in accordance with ISO 6060.

Kits:

According to an aspect of some embodiments of the present invention there is provided a kit usable for practicing the handling of the waste solution as described herein. The kit comprises the super absorbent material as described herein in any respective embodiments. The kit may further comprise a container for effecting the contacting of the waste solution with the super absorbent material therein and/or for storing the obtained solid or semi-solid composition. The super absorbent material is preferably packaged individually in the kit. The kit may comprise one or more packages of the super absorbent material. In some embodiments, an amount of the super absorbent polyacrylate in each package ranges from 500 to 1000 grams. Alternatively, the kit comprises one or more larger packages, for example, of 1500, 2000, 3000, 3500, and/or 4000 grams, and/or larger.

In some embodiments, the kit comprises a lookup table having a plurality of entries, each including a value of a concentration of a support material or a refractive index of the solution and a corresponding value of an amount of the super absorbent polyacrylate sufficient to convert the solution to the solid or semi-solid composition, or recommended for use (for example, as shown in Table 1 in the Examples section that follows), which may also take into consideration the volume of the waste solution, as described herein in any of the respective embodiments.

The kit may further comprise means for determining the concentration of the support material in the solution, for example, a portable instrument for determining the concentration by measuring, for example, density and/or refractive index. In some embodiments, the kit further comprises a portable refractometer.

According to some of any of the embodiments described herein, a kit as described herein can further comprise a support material formulation that provides, when hardened, the water-miscible support material, as described herein in any of the respective embodiments. The support material formulation is preferably packaged individually with the kit.

In cases where the support material provides a hardened support material that is preferably dissolvable in a solution (a cleaning solution) other than water, the kit may further comprise a suitable cleaning solution for removing the hardened support material.

When the cleaning solution features a pH higher than 12, or higher than 10, or higher than 8, or lower than 6, or lower than 4, or lower than 3, the kit may further comprise a pH adjusting agent, for adjusting the pH of the waste solution before contacting with the SAP. Alternatively, the kit may provide instructions to use a higher amount of the SAP, as described herein for waste solutions featuring extreme pH values.

Additive Manufacturing:

According to an aspect of some embodiments of the present invention there is provided a method of additive manufacturing a three-dimensional object, which integrates a method of handling a waste solution as described herein in any of the respective embodiments.

The method according to these embodiments manufactures three-dimensional objects in a layer-wise manner by forming a plurality of layers in a configured pattern corresponding to the shape of the objects, as described herein.

The method is generally effected by sequentially forming a plurality of layers in a configured pattern corresponding to the shape of the object, such that formation of each of at least a few of the layers, or of each of the layers, comprises dispensing a building material (uncured) which comprises one or more modeling material formulation(s) and one or more support material formulations, as described herein, and exposing the dispensed modeling material to a curing condition (e.g., curing energy) to thereby form a printed object, as described in further detail hereinafter.

The final three-dimensional object is made of the modeling material or a combination of modeling materials or a combination of modeling material/s and support material/s or modification thereof (e.g., following curing and removal of the hardened support material). All these operations are well-known to those skilled in the art of solid freeform fabrication.

Figure 4:
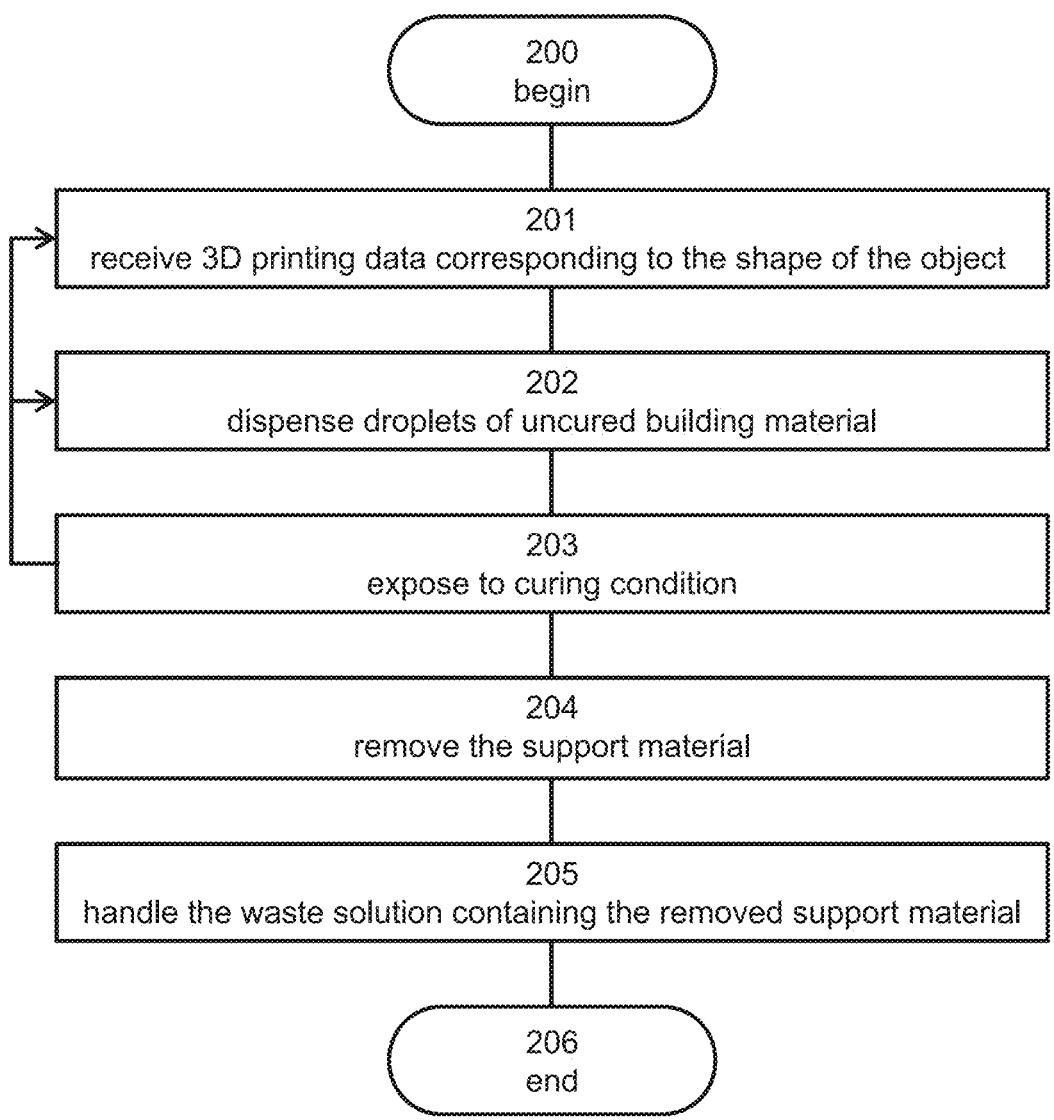
FIG. 4 is a flowchart diagram of a method suitable for AM of a three-dimensional object according to various exemplary embodiments of the present invention.

The method is generally effected as schematically illustrated in FIG. 4, by receiving 201 three-dimensional printing data corresponding to the shape of the object; dispensing 202 droplets of an uncured building material in layers, on a receiving medium, using at least one inkjet printing head, according to the printing data, the uncured building material comprising at least one modeling material formulation and at least one support material formulation that provides, when hardened, a water-miscible support material; subsequent to the dispensing, exposing 203 the layers to a curing condition, to thereby provide a hardened modeling material and a hardened, water-miscible support material; and repeating the dispensing 202 and the exposing 203 to thereby provide a printed object comprising the hardened modeling material and the hardened, water-miscible support material. In some embodiments of the invention in which the 3D printing data is received in batches (e.g., layer by layer, or several layers at a time) the method also loops back from 203 to 201 to receive an additional batch of printing data.

The method then proceeds by removing 204 the hardened support material from the printed object by contacting the printed object with an aqueous solution (a cleaning solution), preferably a detergent-free aqueous solution, to thereby provide the three-dimensional object and an aqueous waste solution containing the water-miscible support material. At 205 the aqueous waste solution is handled as described herein in any of the respective embodiments. The method ends at 206.

The method and system of the present embodiments manufacture three-dimensional objects based on computer object data in a layer-wise manner by forming a plurality of layers in a configured pattern corresponding to the shape of the objects. The computer object data can be in any known format, including, without limitation, a Standard Tessellation Language (STL) or a StercoLithography Contour (SLC) format, Virtual Reality Modeling Language (VRML), Additive Manufacturing File (AMF) format, Drawing Exchange Format (DXF), Polygon File Format (PLY) or any other format suitable for Computer-Aided Design (CAD).

Each layer is formed by additive manufacturing apparatus which scans a two-dimensional surface and patterns it. While scanning, the apparatus visits a plurality of target locations on the two-dimensional layer or surface, and decides, for each target location or a group of target locations, whether or not the target location or group of target locations is to be occupied by building material formulation, and which type of building material formulation is to be delivered thereto. The decision is made according to a computer image of the surface.

In preferred embodiments of the present invention the AM comprises three-dimensional printing, more preferably three-dimensional inkjet printing. In these embodiments a building material formulation is dispensed from a dispensing head having one or more nozzles arrays to deposit building material formulation in layers on a supporting structure. The AM apparatus thus dispenses building material formulation in target locations which are to be occupied and leaves other target locations void. The apparatus typically includes a plurality of dispensing heads, each of which can be configured to dispense a different building material formulation from the different nozzle array. Thus, different target locations can be occupied by different building material formulations.

Herein throughout, some embodiments of the present invention are described in the context of the additive manufacturing being 3D inkjet printing. However, other additive manufacturing processes, such as, but not limited to, SLA and DLP, are contemplated.

When the AM is by three-dimensional printing, an uncured building material, as defined herein, is dispensed from a dispensing head having a set of nozzles to deposit building material in layers on a supporting structure. The AM apparatus thus dispenses building material in target locations which are to be occupied and leaves other target locations void. The apparatus typically includes a plurality of dispensing heads, each of which can be configured to dispense a different building material. Thus, different target locations can be occupied by different building materials (e.g., a modeling formulation and/or a support formulation, as defined herein).

Figure 1A:
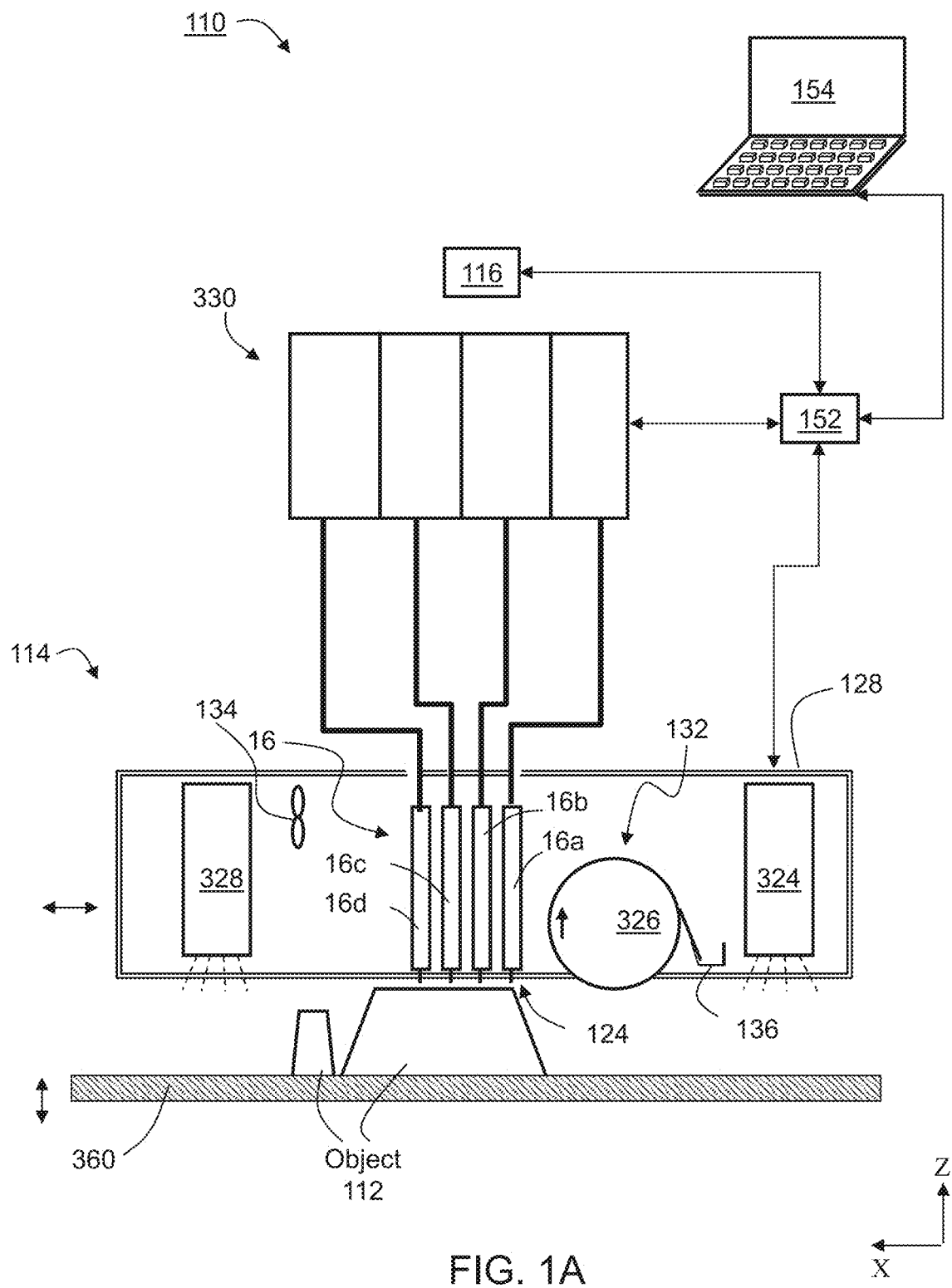
FIGS. 1A-1D are schematic illustrations of an additive manufacturing system according to some embodiments of the invention.
Figure 2A:
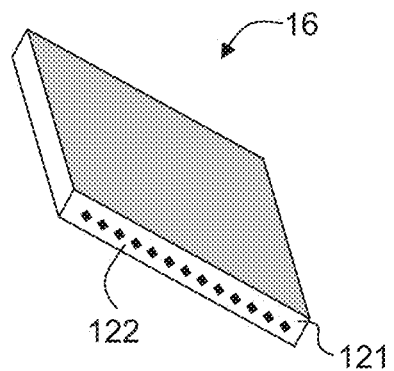
FIGS. 2A-2C are schematic illustrations of print heads according to some embodiments of the present invention.
Figure 2B:
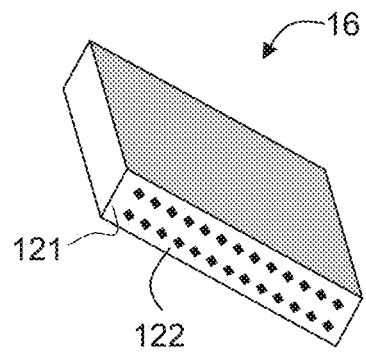
Figure 2C:
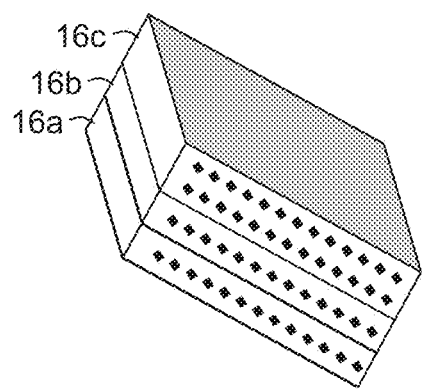

A representative and non-limiting example of a system 110 suitable for AM of an object 112 according to some embodiments of the present invention is illustrated in FIG. 1A. System 110 comprises an additive manufacturing apparatus 114 having a dispensing unit 16 which comprises a plurality of dispensing heads. Each head preferably comprises one or more arrays of nozzles 122, as illustrated in FIGS. 2A-C described below, through which a liquid building material 124 is dispensed.

According to some embodiments of the present invention, apparatus 114 operates at a temperature that does not exceed 35° C.

Preferably, but not obligatorily, apparatus 114 is a three-dimensional inkjet printing apparatus, in which case the dispensing heads are printing heads, and the building material is dispensed via inkjet technology from a printing head having one or more arrays of nozzles to deposit building material formulation in layers on a supporting structure. This need not necessarily be the case, since, for some applications, it may not be necessary for the additive manufacturing apparatus to employ three-dimensional printing techniques. Representative examples of additive manufacturing apparatus contemplated according to various exemplary embodiments of the present invention include, without limitation, fused deposition modeling apparatus and fused material deposition apparatus.

Each dispensing head is optionally and preferably fed via a building material reservoir which may optionally include a temperature control unit (e.g., a temperature sensor and/or a heating device), and a material level sensor. To dispense the building material, a voltage signal is applied to the dispensing heads to selectively deposit droplets of material via the dispensing head nozzles, for example, as in piezoelectric inkjet printing technology. The dispensing rate of each head depends on the number of nozzles or arrays of nozzles, the type of nozzles and the applied voltage signal rate (frequency). Such dispensing heads are known to those skilled in the art of solid freeform fabrication.

Preferably, but not obligatorily, the overall number of dispensing nozzles or nozzle arrays is selected such that half of the dispensing nozzles are designated to dispense support material and half of the dispensing nozzles are designated to dispense modeling material, i.e. the number of nozzles jetting modeling materials is the same as the number of nozzles jetting support material. In the representative example of FIG. 1A, four dispensing heads 16a, 16b, 16c and 16d are illustrated. Each of heads 16a, 16b, 16c and 16d has a nozzle array. In this Example, heads 16a and 16b can be designated for modeling material/s and heads 16c and 16d can be designated for support material. Thus, head 16a can dispense a first modeling material, head 16b can dispense a second modeling material and heads 16c and 16d can both dispense support material. In an alternative embodiment, heads 16c and 16d, for example, may be combined in a single head having two nozzle arrays for depositing support material. In a further alternative embodiment any one or more of the printing heads may have more than one nozzle arrays for depositing more than one material formulation, e.g. two nozzle arrays for depositing two different modeling material formulations or a modeling material formulation and a support material formulation, each formulation via a different array or number of nozzles.

Yet it is to be understood that it is not intended to limit the scope of the present invention and that the number of modeling material printing heads (modeling heads) and the number of support material printing heads (support heads) may differ. Generally, the number of arrays of nozzles that dispense modeling material formulation, the number of arrays of nozzles that dispense support material formulation, and the number of nozzles in each respective array are selected such as to provide a predetermined ratio, a, between the maximal dispensing rate of the support material formulation and the maximal dispensing rate of modeling material formulation. The value of the predetermined ratio, a, is preferably selected to ensure that in each formed layer, the height of modeling material equals the height of support material. Typical values for a are from about 0.6 to about 1.5.

For example, for a=1, the overall dispensing rate of support material is generally the same as the overall dispensing rate of the modeling material when all the arrays of nozzles operate.

For example, apparatus 114 can comprise M modeling heads each having m arrays of p nozzles, and S support heads each having s arrays of q nozzles such that M×m×p=S×s×q. Each of the M×m modeling arrays and S×s support arrays can be manufactured as a separate physical unit, which can be assembled and disassembled from the group of arrays. In this embodiment, each such array optionally and preferably comprises a temperature control unit and a material formulation level sensor of its own, and receives an individually controlled voltage for its operation.

In some embodiments, the temperature control unit of at least a few of the arrays is configured so as not to exceed 45° C., or 40° C., or 35° C.

Apparatus 114 can further comprise a hardening device 324 which can include any device configured to emit light, heat or the like that may cause the deposited material to harden. For example, hardening device 324 can comprise one or more radiation sources, which can be, for example, an ultraviolet or visible or infrared lamp, or other sources of electromagnetic radiation, or electron beam source, depending on the modeling material being used. In some embodiments of the present invention, hardening device 324 serves for curing or solidifying the modeling material.

As used herein, the term "dispensing head" or "depositing head" encompass printing heads which are dispensing heads usable in 3D printing such as 3D inkjet printing.

The dispensing head(s) and radiation source are preferably mounted in a frame or block 128 which is preferably operative to reciprocally move over a tray 360, which serves as the working surface. In some embodiments of the present invention the radiation sources are mounted in the block such that they follow in the wake of the dispensing heads to at least partially cure or solidify the materials just dispensed by the dispensing heads. Tray 360 is positioned horizontally. According to the common conventions an X-Y-Z Cartesian coordinate system is selected such that the X-Y plane is parallel to tray 360. Tray 360 is preferably configured to move vertically (along the Z direction), typically downward. In various exemplary embodiments of the invention, apparatus 114 further comprises one or more leveling devices 132, e.g. a roller 326. Leveling device 326 serves to straighten, level and/or establish a thickness of the newly formed layer prior to the formation of the successive layer thereon. Leveling device 326 preferably comprises a waste collection device 136 for collecting the excess material generated during leveling. Waste collection device 136 may comprise any mechanism that delivers the material to a waste tank or waste cartridge.

In use, the dispensing heads of unit 16 move in a scanning direction, which is referred to herein as the X direction, and selectively dispense building material in a predetermined configuration in the course of their passage over tray 360. The building material typically comprises one or more types of support material and one or more types of modeling material. The passage of the dispensing heads of unit 16 is followed by the curing of the modeling material(s) by radiation source 126. In the reverse passage of the heads, back to their starting point for the layer just deposited, an additional dispensing of building material may be carried out, according to predetermined configuration. In the forward and/or reverse passages of the dispensing heads, the layer thus formed may be straightened by leveling device 326, which preferably follows the path of the dispensing heads in their forward and/or reverse movement. Once the dispensing heads return to their starting point along the X direction, they may move to another position along an indexing direction, referred to herein as the Y direction, and continue to build the same layer by reciprocal movement along the X direction. Alternately, the dispensing heads may move in the Y direction between forward and reverse movements or after more than one forward-reverse movement. The series of scans performed by the dispensing heads to complete a single layer is referred to herein as a single scan cycle.

Once the layer is completed, tray 360 is lowered in the Z direction to a predetermined Z level, according to the desired thickness of the layer subsequently to be printed. The procedure is repeated to form three-dimensional object 112 in a layer-wise manner.

In another embodiment, tray 360 may be displaced in the Z direction between forward and reverse passages of the dispensing head of unit 16, within the layer. Such Z displacement is carried out in order to cause contact of the leveling device with the surface in one direction and prevent contact in the other direction.

System 110 optionally and preferably comprises a building material supply system 330 which comprises the building material containers or cartridges and supplies a plurality of building materials to fabrication apparatus 114.

A control unit 152 controls fabrication (e.g., printing) apparatus 114 and optionally and preferably also supply system 330. Control unit 152 typically includes an electronic circuit configured to perform the controlling operations. Control unit 152 preferably communicates with a data processor 154 which transmits digital data pertaining to fabrication instructions based on computer object data, e.g., a CAD configuration represented on a computer readable medium in a form of a Standard Tessellation Language (STL) format or the like. Typically, control unit 152 controls the voltage applied to each dispensing head or nozzle array and the temperature of the building material in the respective printing head or respective nozzle array, as described herein.

According to some embodiments of the present invention, control unit 152 is operated such that the temperature of the building material (uncured) does not exceed 40° C. or 35° C.

Once the manufacturing data is loaded to control unit 152 it can operate without user intervention. In some embodiments, control unit 152 receives additional input from the operator, e.g., using data processor 154 or using a user interface 116 communicating with unit 152. User interface 116 can be of any type known in the art, such as, but not limited to, a keyboard, a touch screen and the like. For example, control unit 152 can receive, as additional input, one or more building material types and/or attributes, such as, but not limited to, color, characteristic distortion and/or transition temperature, viscosity, electrical property, magnetic property. Other attributes and groups of attributes are also contemplated.

Figure 1B:
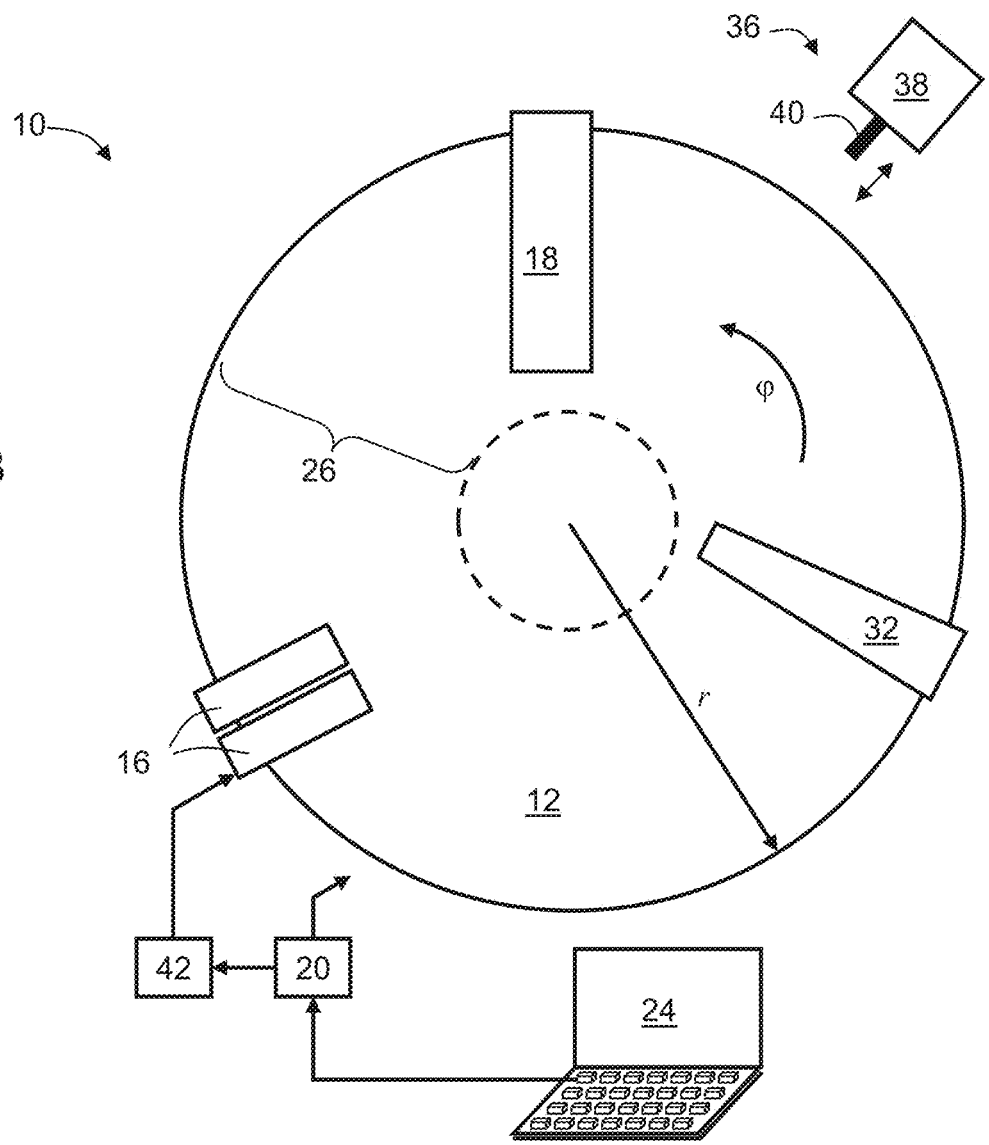
Figure 1C:
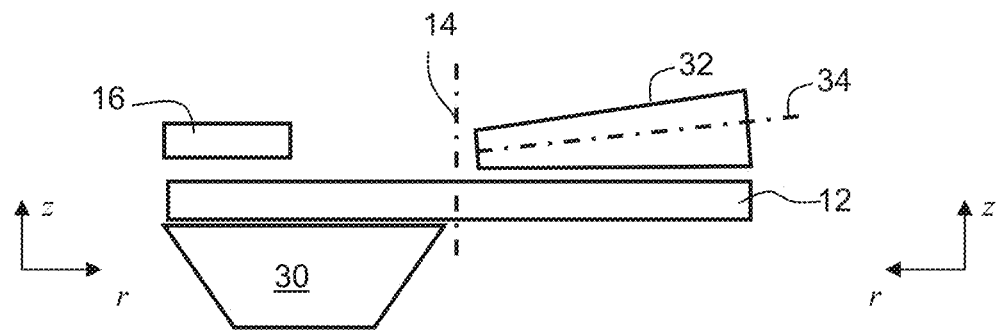
Figure 1D:
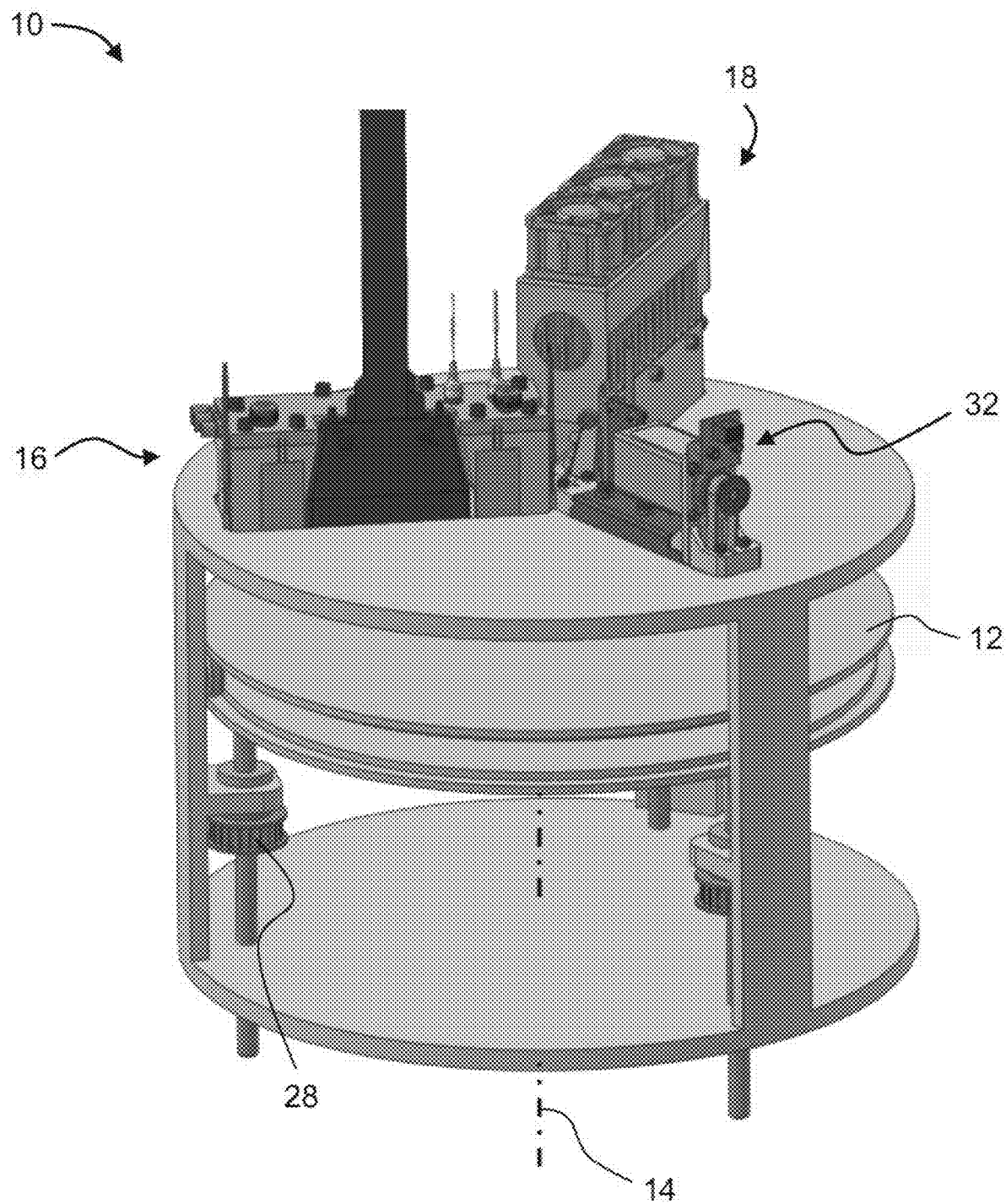

Another representative and non-limiting example of a system 10 suitable for AM of an object according to some embodiments of the present invention is illustrated in FIGS. 1B-D. FIGS. 1B-D illustrate a top view (FIG. 1B), a side view (FIG. 1C) and an isometric view (FIG. 1D) of system 10.

In the present embodiments, system 10 comprises a tray 12 and a plurality of inkjet printing heads 16, each having each having one or more arrays of nozzles with respective one or more pluralities of separated nozzles. Tray 12 can have a shape of a disk or it can be annular. Non-round shapes are also contemplated, provided they can be rotated about a vertical axis. Printing heads 16 can be any of the printing heads described above with respect to system 110.

Tray 12 and heads 16 are optionally and preferably mounted such as to allow a relative rotary motion between tray 12 and heads 16. This can be achieved by (i) configuring tray 12 to rotate about a vertical axis 14 relative to heads 16, (ii) configuring heads 16 to rotate about vertical axis 14 relative to tray 12, or (iii) configuring both tray 12 and heads 16 to rotate about vertical axis 14 but at different rotation velocities (e.g., rotation at opposite direction). While the embodiments below are described with a particular emphasis to configuration (i) wherein the tray is a rotary tray that is configured to rotate about vertical axis 14 relative to heads 16, it is to be understood that the present application contemplates also configurations (ii) and (iii). Any one of the embodiments described herein can be adjusted to be applicable to any of configurations (ii) and (iii), and one of ordinary skills in the art, provided with the details described herein, would know how to make such adjustment.

In the following description, a direction parallel to tray 12 and pointing outwardly from axis 14 is referred to as the radial direction r, a direction parallel to tray 12 and perpendicular to the radial direction r is referred to herein as the azimuthal direction $\varphi$, and a direction perpendicular to tray 12 is referred to herein is the vertical direction z.

The term "radial position," as used herein, refers to a position on or above tray 12 at a specific distance from axis 14. When the term is used in connection to a printing head, the term refers to a position of the head which is at specific distance from axis 14. When the term is used in connection to a point on tray 12, the term corresponds to any point that belongs to a locus of points that is a circle whose radius is the specific distance from axis 14 and whose center is at axis 14.

The term "azimuthal position," as used herein, refers to a position on or above tray 12 at a specific azimuthal angle relative to a predetermined reference point. Thus, radial position refers to any point that belongs to a locus of points that is a straight line forming the specific azimuthal angle relative to the reference point.

The term "vertical position," as used herein, refers to a position over a plane that intersect the vertical axis 14 at a specific point.

Tray 12 serves as a supporting structure for three-dimensional printing. The working area on which one or objects are printed is typically, but not necessarily, smaller than the total area of tray 12. In some embodiments of the present invention the working area is annular. The working area is shown at 26. In some embodiments of the present invention tray 12 rotates continuously in the same direction throughout the formation of object, and in some embodiments of the present invention tray reverses the direction of rotation at least once (e.g., in an oscillatory manner) during the formation of the object. Tray 12 is optionally and preferably removable. Removing tray 12 can be for maintenance of system 10, or, if desired, for replacing the tray before printing a new object. In some embodiments of the present invention system 10 is provided with one or more different replacement trays (e.g., a kit of replacement trays), wherein two or more trays are designated for different types of objects (e.g., different weights) different operation modes (e.g., different rotation speeds), etc. The replacement of tray 12 can be manual or automatic, as desired. When automatic replacement is employed, system 10 comprises a tray replacement device 36 configured for removing tray 12 from its position below heads 16 and replacing it by a replacement tray (not shown). In the representative illustration of FIG. 1B tray replacement device 36 is illustrated as a drive 38 with a movable arm 40 configured to pull tray 12, but other types of tray replacement devices are also contemplated.

Exemplified embodiments for the printing head 16 are illustrated in FIGS. 2A-C. These embodiments can be employed for any of the AM systems described above, including, without limitation, system 110 and system 10.

FIGS. 2A-B illustrate a printing head 16 with one (FIG. 2A) and two (FIG. 2B) nozzle arrays 22. The nozzles in the array are preferably aligned linearly, along a straight line. In embodiments in which a particular printing head has two or more linear nozzle arrays, the nozzle arrays are optionally and preferably can be parallel to each other. When a printing head has two or more arrays of nozzles (e.g., FIG. 2B) all arrays of the head can be fed with the same building material formulation, or at least two arrays of the same head can be fed with different building material formulations.

When a system similar to system 110 is employed, all printing heads 16 are optionally and preferably oriented along the indexing direction with their positions along the scanning direction being offset to one another.

When a system similar to system 10 is employed, all printing heads 16 are optionally and preferably oriented radially (parallel to the radial direction) with their azimuthal positions being offset to one another. Thus, in these embodiments, the nozzle arrays of different printing heads are not parallel to each other but are rather at an angle to each other, which angle being approximately equal to the azimuthal offset between the respective heads. For example, one head can be oriented radially and positioned at azimuthal position $\varphi_1$, and another head can be oriented radially and positioned at azimuthal position $\varphi_2$. In this example, the azimuthal offset between the two heads is $\varphi_1$-$\varphi_2$, and the angle between the linear nozzle arrays of the two heads is also $\varphi_1$-$\varphi_2$.

In some embodiments, two or more printing heads can be assembled to a block of printing heads, in which case the printing heads of the block are typically parallel to each other. A block including several inkjet printing heads 16a, 16b, 16c is illustrated in FIG. 2C.

In some embodiments, system 10 comprises a support structure 30 positioned below heads 16 such that tray 12 is between support structure 30 and heads 16. Support structure 30 may serve for preventing or reducing vibrations of tray 12 that may occur while inkjet printing heads 16 operate. In configurations in which printing heads 16 rotate about axis 14, support structure 30 preferably also rotates such that support structure 30 is always directly below heads 16 (with tray 12 between heads 16 and tray 12).

Tray 12 and/or printing heads 16 is optionally and preferably configured to move along the vertical direction z, parallel to vertical axis 14 so as to vary the vertical distance between tray 12 and printing heads 16. In configurations in which the vertical distance is varied by moving tray 12 along the vertical direction, support structure 30 preferably also moves vertically together with tray 12. In configurations in which the vertical distance is varied by heads 16 along the vertical direction, while maintaining the vertical position of tray 12 fixed, support structure 30 is also maintained at a fixed vertical position.

The vertical motion can be established by a vertical drive 28. Once a layer is completed, the vertical distance between tray 12 and heads 16 can be increased (e.g., tray 12 is lowered relative to heads 16) by a predetermined vertical step, according to the desired thickness of the layer subsequently to be printed. The procedure is repeated to form a three-dimensional object in a layer-wise manner.

The operation of inkjet printing heads 16 and optionally and preferably also of one or more other components of system 10, e.g., the motion of tray 12, are controlled by a controller 20. The controller can have an electronic circuit and a non-volatile memory medium readable by the circuit, wherein the memory medium stores program instructions which, when read by the circuit, cause the circuit to perform control operations as further detailed below.

Controller 20 can also communicate with a host computer 24 which transmits digital data pertaining to fabrication instructions based on computer object data, e.g., in a form of a Standard Tessellation Language (STL) or a StereoLithography Contour (SLC) format, Virtual Reality Modeling Language (VRML), Additive Manufacturing File (AMF) format, Drawing Exchange Format (DXF), Polygon File Format (PLY) or any other format suitable for Computer-Aided Design (CAD). The object data formats are typically structured according to a Cartesian system of coordinates. In these cases, computer 24 preferably executes a procedure for transforming the coordinates of each slice in the computer object data from a Cartesian system of coordinates into a polar system of coordinates. Computer 24 optionally and preferably transmits the fabrication instructions in terms of the transformed system of coordinates. Alternatively, computer 24 can transmit the fabrication instructions in terms of the original system of coordinates as provided by the computer object data, in which case the transformation of coordinates is executed by the circuit of controller 20.

Figure 3A:
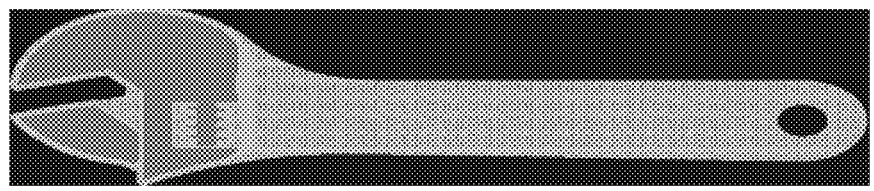
FIGS. 3A and 3B are schematic illustrations demonstrating coordinate transformations according to some embodiments of the present invention.
Figure 3B:
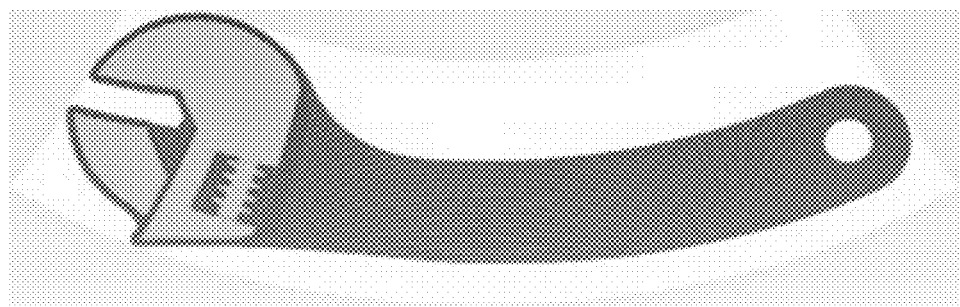

The transformation of coordinates allows three-dimensional printing over a rotating tray. In non-rotary systems with a stationary tray with the printing heads typically reciprocally move above the stationary tray along straight lines. In such systems, the printing resolution is the same at any point over the tray, provided the dispensing rates of the heads are uniform. In system 10, unlike non-rotary systems, not all the nozzles of the head points cover the same distance over tray 12 during at the same time. The transformation of coordinates is optionally and preferably executed so as to ensure equal amounts of excess material at different radial positions. Representative examples of coordinate transformations according to some embodiments of the present invention are provided in FIGS. 3A-B, showing three slices of an object (each slice corresponds to fabrication instructions of a different layer of the objects), where FIG. 3A illustrates a slice in a Cartesian system of coordinates and FIG. 3B illustrates the same slice following an application of a transformation of coordinates procedure to the respective slice.

Typically, controller 20 controls the voltage applied to the respective component of the system 10 based on the fabrication instructions and based on the stored program instructions as described below.

Generally, controller 20 controls printing heads 16 to dispense, during the rotation of tray 12, droplets of building material in layers, such as to print a three-dimensional object on tray 12.

System 10 optionally and preferably comprises one or more radiation sources 18, which can be, for example, an ultraviolet or visible or infrared lamp, or other sources of electromagnetic radiation, or electron beam source, depending on the modeling material being used. Radiation source can include any type of radiation emitting device, including, without limitation, light emitting diode (LED), digital light processing (DLP) system, resistive lamp and the like. Radiation source 18 serves for curing or solidifying the modeling material. In various exemplary embodiments of the invention the operation of radiation source 18 is controlled by controller 20 which may activate and deactivate radiation source 18 and may optionally also control the amount of radiation generated by radiation source 18.

In some embodiments of the invention, system 10 further comprises one or more leveling devices 32 which can be manufactured as a roller or a blade. Leveling device 32 serves to straighten the newly formed layer prior to the formation of the successive layer thereon. In some embodiments, leveling device 32 has the shape of a conical roller positioned such that its symmetry axis 34 is tilted relative to the surface of tray 12 and its surface is parallel to the surface of the tray. This embodiment is illustrated in the side view of system 10 (FIG. 2C).

The conical roller can have the shape of a cone or a conical frustum.

The opening angle of the conical roller is preferably selected such that there is a constant ratio between the radius of the cone at any location along its axis 34 and the distance between that location and axis 14. This embodiment allows roller 32 to efficiently level the layers, since while the roller rotates, any point p on the surface of the roller has a linear velocity which is proportional (e.g., the same) to the linear velocity of the tray at a point vertically beneath point p. In some embodiments, the roller has a shape of a conical frustum having a height h, a radius $R_1$ at its closest distance from axis 14, and a radius $R_2$ at its farthest distance from axis 14, wherein the parameters h, $R_1$ and $R_2$ satisfy the relation $R_1/R_2=(R-h)/h$ and wherein R is the farthest distance of the roller from axis 14 (for example, R can be the radius of tray 12).

The operation of leveling device 32 is optionally and preferably controlled by controller 20 which may activate and deactivate leveling device 32 and may optionally also control its position along a vertical direction (parallel to axis 14) and/or a radial direction (parallel to tray 12 and pointing toward or away from axis 14.

In some embodiments of the present invention printing heads 16 are configured to reciprocally move relative to tray along the radial direction r. These embodiments are useful when the lengths of the nozzle arrays 22 of heads 16 are shorter than the width along the radial direction of the working area 26 on tray 12. The motion of heads 16 along the radial direction is optionally and preferably controlled by controller 20.

Some embodiments contemplate the fabrication of an object by dispensing different materials from different arrays of nozzles (belonging to the same or different printing head). These embodiments provide, inter alia, the ability to select materials from a given number of materials and define desired combinations of the selected materials and their properties. According to the present embodiments, the spatial locations of the deposition of each material with the layer is defined, either to effect occupation of different three-dimensional spatial locations by different materials, or to effect occupation of substantially the same three-dimensional location or adjacent three-dimensional locations by two or more different materials so as to allow post deposition spatial combination of the materials within the layer, thereby to form a composite material at the respective location or locations.

Any post deposition combination or mix of modeling materials is contemplated. For example, once a certain material is dispensed it may preserve its original properties. However, when it is dispensed simultaneously with another modeling material or other dispensed materials which are dispensed at the same or nearby locations, a composite material having a different property or properties to the dispensed materials is formed.

Further details on the principles and operations of an AM system suitable for the present embodiments are found in U.S. Pat. No. 9,031,680, and International Publication No. WO2016/009426, the contents of which are hereby incorporated by reference.

Reference is now made to FIGS. 8A and 8B which are schematic illustrations of a system 80 for determining an amount of a substance sufficient to convert a liquid solution 82 into a solid or semi-solid composition. System 80 is particularly useful for determining the minimal amount of super absorbent material that is required for converting a waste solution containing a support material into as a solid or semi-solid composition. In these embodiments, system 80 can be used for executing selected operation of the method described above, e.g., operation 205.

System 80 comprises a digital refractometer 84 configured for measuring a refractive index of the solution. Refractometer 84 can be a portable refractometer, as illustrated in FIG. 8A, or it can be integrated within a container 86 that is constituted to hold the solution, as illustrated in FIG. 8B. Refractometer 84 can be configured to be submerged in solution 82, or it can be configured to receive drops of solution 82 and measure refractive index of these drops.

In some embodiments of the present invention container 86 is a component of system 80. Container 86 can comprise a stirrer 96 for stirring solution 82 in container 86. Container 86 can also comprise a controllable drain port 98 for controllably draining solution 82 out of container 86. Typically, the solution is drained after the sufficient amount of the substance has been determined, but before it is contacted with the substance. The advantage of this embodiments is that it is easier to drain solution 82 while it is in liquid form, thereby making container 86 reusable.

Refractometer 84 can be of any type, such as, but not limited to, an Abbe refractometer or a Pulfrich refractometer. Refractometers suitable for use as refractometer 84 are commercially available, for example, from ATAGO, Japan, from Thermo Fisher Scientific, USA, and from Euromex, the Netherlands.

System 80 also comprises a dedicated electronic circuit 88 configured to determine the amount of the substance (e.g., the the required amount of super absorbent material) based on at least the measured refractive index, and a display 92 configured for displaying the determined amount.

In some embodiments of the present invention refractometer 84, circuit 88, and display 92 are all encapsulated in, or mounted on, an encapsulation. When refractometer 84 is portable, the entire encapsulation can be configured to be submerged in solution 82, as illustrated in FIG. 8A.

In some embodiments of the present invention refractometer 84, circuit 88, and display 92 are all encapsulated in, or mounted on, container 86, as illustrated in FIG. 8B.

Circuit 88 can determine the amount using a lookup table. For example, circuit 88 can be in a form of a chip having a storage region that stores a lookup table which includes a plurality of entries, each including a lookup table refractive index value and a corresponding lookup table amount of the substance. Alternatively, circuit 88 can be associated with a separate computer readable storage medium (not shown) that stores the lookup table, wherein the circuit 88 is configured to access the storage medium and loads the lookup table from the storage medium. Still alternatively, circuit 88 can be configured to download an updated version of the lookup table from a dedicated internet site.

Circuit 88 can receive from refractometer 84 a digital signal pertaining to the measured refractive index, and search the lookup table for an entry that includes a lookup table refractive index that best matches the measured refractive index. Circuit 88 then defines the corresponding lookup table amount as the amount of the substance that is sufficient to convert liquid solution 82 into a solid or semi-solid composition.

In some embodiments of the present invention system 80 comprises a user interface 90, such as, but not limited to, a graphical user interface, or set of buttons controlling a display, for allowing the user to enter additional data that may aid in determining the amount substance.

For example, when system 80 is used for determining the minimal amount of super absorbent material that is required for converting a waste solution containing a support material into as a solid or semi-solid composition, user interface 90 can present the user with a list of types support materials and/or a list of types super absorbent materials to select from. Circuit 88 can receive the selected material(s) from interface 90 as input and select from a plurality of lookup tables, as further detailed hereinabove, the lookup table that corresponds to the input.

User interface 90 can also allow the user to enter the volume of the solution in container 86, e.g., by presenting the user with a list of volumes to select from, or providing a text field into which the user can fills the volume. Circuit 88 can receive the volume from interface 90 as input and search the lookup table for an entry that best matches both the measured refractive index, and the entered volume.

It is to be appreciated that it is not necessary for system 80 to include a user interface. For example, the lookup table used by circuit 88, can be prepared for a specific and predetermined type of support material and/or a specific and predetermined type of super absorbent material, in which case no input pertaining to these materials is required, and system 80 can be devoid of a user interface that allows selecting the respective materials. Similarly, the lookup table used by circuit 88, can be prepared for a specific and predetermined volume of the solution, in which case no input pertaining to the volume is required, and system 80 can be devoid of a user interface that allows entering the volume of the solution.

When container 86 is a component of system 80, it can include a liquid level sensor 94, that generates a signal pertaining to the level of the solution in container 86. Circuit 88 can receive a signal from sensor 94, determine the volume automatically based on the sensed liquid level, and search the lookup table for an entry that best matches both the measured refractive index, and the automatically determined volume of the solution.

It is expected that during the life of a patent maturing from this application many relevant support material formulations that provide water-soluble hardened support material and/or cleaning solutions will be developed. The scope of the term "cleaning solution" is intended to include all such new technologies a priori. The scope of the term "water-soluble support material" is intended to include hardened support materials formed of such new technologies a priori.

As used herein the term "about" refers to ±10% or ±5%.

The terms "comprises", "comprising", "includes", "including", "having" and their conjugates mean "including but not limited to".

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise. For example, the term "a compound" or "at least one compound" may include a plurality of compounds, including mixtures thereof.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

As used herein the term "method" refers to manners, means, techniques and procedures for accomplishing a given task including, but not limited to, those manners, means, techniques and procedures either known to, or readily developed from known manners, means, techniques and procedures by practitioners of the chemical, pharmacological, biological, biochemical and medical arts.

Herein throughout, whenever the phrase "weight percent" is indicated in the context of embodiments of a support material formulation, it is meant weight percent of the total weight of the uncured support material formulation as described herein.

The phrase "weight percent" is also referred to herein as "% by weight" or "% wt.".

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Various embodiments and aspects of the present invention as delineated hereinabove and as claimed in the claims section below find experimental support in the following examples.

EXAMPLES

Reference is now made to the following examples, which together with the above descriptions illustrate some embodiments of the invention in a non limiting fashion.

Example 1

Sorbent Screening

Preliminary screening assays were performed using 12 commercially available sorbents, including organic polymers, typically various salts of polyacrylates, featuring various degrees of cross-linking, particle size distributions and absorption capabilities, and inorganic (mineral) sorbents such as Celite and Attapulgite.

1 gram of the tested sorbent was added to about 90 mL of an aqueous solution obtained upon dissolving an exemplary hardened support material that is soluble in water (e.g., as described herein), at a concentration of 7% by weight. The sorbent performance was evaluated by the level of absorption after 2 hours, the homogeneity, and by the Paint test [EPA (U.S. Environmental Protection Agency) Test Method 9095B], a method used to determine the presence of free liquids in a representative sample of waste.

These preliminary tests uncovered that mineral sorbents did not absorb the tested solution, while polyacrylate-type super absorbent polymers successfully passed the test.

The super absorbent polymers (SAPs) that exhibited the best performance in the preliminary assays were further tested on a larger scale, by adding 4 or 6 grams of the SAP to a 100 mL waste solution containing 20% by weight of dissolved support material. It was uncovered that the best performance was observed while using super absorbent polyacrylate which comprises more than 10% particles having a size lower than 300 micrometers.

An exemplary SAP that performed well in the preliminary assays is a sodium polyacrylate marketed by Socco under the tradename SNN580H.

The present inventors have further tested the performance of SAP in combination with waste solutions formed of other soluble support materials.

More specifically, the present inventors have tested waste solutions formed upon dissolving hardened support materials in alkaline solutions, containing for example, 1-5% sodium hydroxide and/or 1-5% sodium metasilicate. Such waste solutions feature pH of at least 14.

Such waste solutions, containing 10% of dissolved supper material were neutralized with citric acid to obtain pH of about 7. 100 ml of each solution was contacted with 6.5 of a super absorbent polyacrylate as described herein and subjected to the Paint test as described herein.

As shown in the photograph presented in FIG. 5A, all the tested waste solutions were fully absorbed.

In another set of experiments, the same waste solutions were treated with citric acid to provide solutions featuring pH of 7 or 8, and were compared with waste solutions featuring pH of about 14 (non-treated). Each 100-ml solution was contacted with 5 of a super absorbent polyacrylate as described herein and subjected to the Paint test as described herein. Solutions featuring pH other than 7 did not pass the test (data not shown).

In another set of experiments, 100-ml waste solutions formed upon dissolving hardened support materials that are soluble in alkaline solutions (to a concentration of 10% by weight), containing for example, 1-5% sodium hydroxide and/or 1-5% sodium metasilicate, and featuring pH of at least 14, were contacted with 17 grams of the super absorbent polyacrylate. As shown in FIG. 5B, using a higher amount of the super absorbent material resulted in satisfactory performance.

Example 2

Waste Management Design

The correlation between the amount of the water-soluble support material (or water miscible support material) (WSS) in the wastewater and the required amount of the SAP was tested in varying sample volumes.

As an exemplary WSS, a hardened support material formed of a support formulation that comprises a hydrophilic mono-functional acrylate, a branched polyol having molecular weight lower than 1,000, or lower than 800 grams/mol; and a polyester having a molecular weight higher than 500 grams/mol, which is liquid at room temperature, was used.

Wastewater samples of a volume of 100 mL, 2 L, 10 L and 20 L, each containing 9.75%, 15% or 20% by weight of dissolved WSS were contacted with varying amount of the SAP. The obtained data is shown in FIG. 6A, and show that the required amount of SAP depends on both the wastewater volume and the WSS concentration therein. FIG. 6B is a bar graph representation of the obtained data.

Upon generating an index for an amount required for a waste sample volume and concentration, means for rapidly determining the concentration of the WSS in a sample were designed.

Wastewater samples containing varying concentrations (10-30% by weight) of dissolved WSS as described above were tested using a densitometer, a laboratory refractometer and a portable refractometer. The obtained data are presented in FIGS. 7A-B, and clearly show a linear correlation, between the concentration and the density (FIG. 7A), and between the concentration and the refractive index (FIG. 7B).

Example 3

Stability and Ranges

The compatibility of the disclosed methodology when using excess SAP, and the stability of the obtained composition (upon contacting wastewater) over time was tested.

A 10 L wastewater sample containing 10% by weight of an exemplary WSS as described herein, which is soluble in water was contacted with 250 grams of the selected SAP, in accordance with FIG. 6B, and with 2-fold amount, and 4-fold amount of the SAP, and the performance was determined by the Paint test [EPA (U.S. Environmental Protection Agency) Test Method 9095B], upon contacting and after storage at room temperature for one month. All samples passed the Paint test, also upon one-month storage, showing that the obtained composition is stable over time, and that the amount of SAP can be extended while maintaining its performance.

Example 4

Waste Management Method

An exemplary method of handling the wastewater obtained upon removal of a WSS from a 3D object prepared by AM has therefore been designed as follows:

A laboratory or portable refractometer is calibrated with two drops of water.

A wastewater solution is mixed and the refractive index of 2 drops of the solution are measured. A concentration of the WSS in the wastewater is determined in accordance with the data presented in FIG. 6B.

An amount of the SAP to be added is determined in accordance with a look up table generated per the data presented in FIGS. 7A-B. Table 1 below presents an exemplary look up table.

The wastewater solution is poured into a leak-proof container and the determined amount of SAP is added thereto. The container is closed and after obtaining a solidified composition is disposed according to local regulations for non-hazardous solid waste.

TABLE 1

| % WSS in water | Refractive Index | Amount of SAP (kg) | | |
|---|---|---|---|---|
| | | 2 L waste | 10 L waste | 20 L waste |
| 20% | 1.361-1.362 | 0.5 | 2 | 4.5 |
| 15% | 1.354-1.356 | 0.5 | 1.5 | 3.5 |
| 10% | 1.346-1.348 | 0.5 | 0.5 | 0.5 |

A method as described herein may further include determining the pH of the waste solution, and adjusting the pH of waste solution to about 7.

A method as described herein may further include determining the pH of the waste solution, and, in case the pH is higher or lower than 7 by more than 0.5 or more than 1 pH unit, adding an amount of the SAP that is 2-folds or 3-folds the recommended amount.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

It is the intent of the applicant(s) that all publications, patents and patent applications referred to in this specification are to be incorporated in their entirety by reference into the specification, as if each individual publication, patent or patent application was specifically and individually noted when referenced that it is to be incorporated herein by reference. In addition, citation or identification of any reference in this application shall not be construed as an admission that such reference is available as prior art to the present invention. To the extent that section headings are used, they should not be construed as necessarily limiting. In addition, any priority document(s) of this application is/are hereby incorporated herein by reference in its/their entirety.

What is claimed is:

1. A method of handling an aqueous waste solution containing a water-miscible support material removed from a three-dimensional object obtained by additive manufacturing, the method comprising:

determining a concentration of said water-miscible support material in the aqueous waste solution; and contacting said aqueous waste solution with a super absorbent polymeric material, wherein said contacting is with an amount of said super absorbent polymeric material to convert said solution to a solid or semi-solid composition, and wherein said amount of said super absorbent polymeric material is determined according to said concentration of said water-miscible support material in the aqueous waste solution.

2. The method of claim 1, wherein said determining is by measuring a refractive index of said solution.

3. The method of claim 2, wherein determining said amount of said super absorbent polymeric material is in accordance with a calibration curve or a lookup table having a plurality of entries, each including a value of said concentration or said refractive index and a corresponding value of an amount of said super absorbent polymeric material to convert said solution to said solid or semi-solid composition.

4. The method of claim 3, wherein said corresponding value of said amount of said super absorbent polymeric material is in accordance with a volume of the solution.

5. The method of claim 4, wherein said contacting is with an amount of the said polymeric material in a range of from 1 to 10 folds the amount determined in accordance with said calibration curve or said lookup table and in accordance with the volume of the solution.

6. The method of claim 1, wherein:

a 2-liter solution that comprises about 10% by weight of said water-miscible support material is contacted with at least 50 grams of said super absorbent polymeric material;

a 10-liter solution that comprises about 10% by weight of said water-miscible support material is contacted with at least 250 grams of said super absorbent polymeric material;

a 20-liter solution that comprises about 10% by weight of said water-miscible support material is contacted with at least 500 grams of said super absorbent polymeric material;

a 2-liter solution that comprises about 15% by weight of said water-miscible support material is contacted with at least 300 grams of said super absorbent polymeric material;

a 10-liter solution that comprises about 15% by weight of said water-miscible support material is contacted with at least 1500 grams of said super absorbent polymeric material;

a 20-liter solution that comprises about 15% by weight of said water-miscible support material is contacted with at least 3500 grams of said super absorbent polymeric material;

a 2-liter solution that comprises about 20% by weight of said water-miscible support material is contacted with at least 400 grams of said super absorbent polymeric material;

a 10-liter solution that comprises about 20% by weight of said water-miscible support material is contacted with at least 2000 grams of said super absorbent polymeric material; and a 20-liter solution that comprises about 20% by weight of said water-miscible support material is contacted with at least 4500 grams of said super absorbent polymeric material.

7. The method of claim 1, wherein:

a 2-liter solution that comprises from about 10% to about 20% by weight of said soluble support material is contacted with at least 500 grams of said super absorbent polymeric material;

a 2-liter to 10-liter solution that comprises about 10% by weight of said soluble support material is contacted with at least 500 grams of said super absorbent polymeric material;

a 10-liter solution that comprises about 15% by weight of said soluble support material is contacted with at least 1500 grams of said super absorbent polymeric material;

a 20-liter solution that comprises about 15% by weight of said soluble support material is contacted with at least 3500 grams of said super absorbent polymeric material;

a 10-liter solution that comprises about 20% by weight of said soluble support material is contacted with at least 2000 grams of said super absorbent polymeric material; and a 20-liter solution that comprises about 20% by weight of said soluble support material is contacted with at least 4500 grams of said super absorbent polymeric material.

8. The method of claim 1, wherein said contacting is performed in a leak-proof container.

9. The method of claim 1, further comprising disposing said solid or semi-solid composition.

10. The method of claim 9, wherein said disposing is effected from 10 minutes to 6 months following said contacting.

11. The method of claim 1, wherein said super absorbent polymeric material is a super absorbent polyacrylate.

12. The method of claim 1, wherein said waste solution is such that features a chemical oxygen demand higher than 1000 mg/liter at a 1% by weight concentration of said water-miscible support material.

13. The method of claim 1, further comprising, prior to said contacting, determining a pH of said waste solution.

14. The method of claim 13, wherein when said pH is outside a range of from 3 to 12, or from 3 to 10, or from 4 to 8, or from 6 to 8, or is other than about 7, the method further comprises adding a pH adjusting agent to the waste solution prior to said contacting.

* * * * *